(12) United States Patent
Kam et al.

(10) Patent No.: US 11,967,585 B2
(45) Date of Patent: Apr. 23, 2024

(54) ELECTRODES FOR LIGHT EMITTING ELEMENT OF A DISPLAY DEVICE

(71) Applicant: Samsung Display Co., Ltd., Yongin-si (KR)

(72) Inventors: Bum Soo Kam, Yongin-si (KR); Eui Kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 553 days.

(21) Appl. No.: 17/088,427

(22) Filed: Nov. 3, 2020

(65) Prior Publication Data

US 2021/0134769 A1    May 6, 2021

(30) Foreign Application Priority Data

Nov. 4, 2019    (KR) .......................... 10-2019-0139782

(51) Int. Cl.
| | |
|---|---|
| *H01L 25/075* | (2006.01) |
| *H01L 23/00* | (2006.01) |
| *H01L 25/16* | (2023.01) |
| *H01L 33/62* | (2010.01) |

(52) U.S. Cl.
CPC .......... *H01L 25/0753* (2013.01); *H01L 24/24* (2013.01); *H01L 25/167* (2013.01); *H01L 33/62* (2013.01); *H01L 2224/24011* (2013.01)

(58) Field of Classification Search
CPC ... H01L 24/24; H01L 25/0753; H01L 25/167; H01L 33/62; H01L 2224/24011; H01L 33/38

USPC ........................................................ 257/91
See application file for complete search history.

(56) References Cited

U.S. PATENT DOCUMENTS

| | | | |
|---|---|---|---|
| 2008/0186288 A1* | 8/2008 | Chang ..................... | G06F 3/045 345/174 |
| 2017/0222186 A1* | 8/2017 | Nozawa .............. | H01L 51/5206 |
| 2018/0019426 A1* | 1/2018 | Im ........................ | H01L 25/0753 |
| 2018/0151643 A1* | 5/2018 | Lee ...................... | H01L 51/5012 |
| 2018/0175009 A1* | 6/2018 | Kim ..................... | H01L 25/0753 |

(Continued)

FOREIGN PATENT DOCUMENTS

| | | |
|---|---|---|
| KR | 10-2019-0016173 A | 2/2019 |
| KR | 20200123900 A | 11/2020 |

(Continued)

*Primary Examiner* — Michelle Mandala
*Assistant Examiner* — Jordan M Klein
(74) *Attorney, Agent, or Firm* — Lewis Roca Rothgerber Christie LLP

(57) ABSTRACT

A display device includes a substrate, a first electrode, and a second electrode spaced from each other on the substrate, a first insulating layer on the first electrode, a first light emitting element between the first electrode and the second electrode, a second light emitting element on the first insulating layer and spaced from the first light emitting element, and a second insulating layer on the first insulating layer and covering at least a portion of the second light emitting element, wherein the first insulating layer includes at least one first opening penetrating the first insulating layer to expose a portion of the first electrode, the second insulating layer includes at least one second opening penetrating the second insulating layer to expose a portion of the first insulating layer, the at least one first opening and the at least one second opening do not overlap each other.

20 Claims, 17 Drawing Sheets

(56) References Cited

U.S. PATENT DOCUMENTS

| | | | |
|---|---|---|---|
| 2018/0175106 A1* | 6/2018 | Kim | H01L 25/167 |
| 2019/0173034 A1* | 6/2019 | Im | H01L 51/0512 |
| 2020/0020672 A1* | 1/2020 | Xi | H01L 27/1214 |
| 2020/0044116 A1* | 2/2020 | Chen | H01L 33/62 |
| 2021/0057610 A1 | 2/2021 | Yang et al. | |
| 2021/0074769 A1 | 3/2021 | Park et al. | |
| 2021/0288217 A1* | 9/2021 | Li | H01L 25/167 |
| 2021/0327954 A1* | 10/2021 | Cho | H01L 27/156 |
| 2022/0037568 A1* | 2/2022 | Kwag | H01L 25/167 |

FOREIGN PATENT DOCUMENTS

| | | |
|---|---|---|
| KR | 20210022799 A | 3/2021 |
| KR | 20210031586 A | 3/2021 |
| KR | 20210073677 A | 6/2021 |

* cited by examiner

FIG. 1
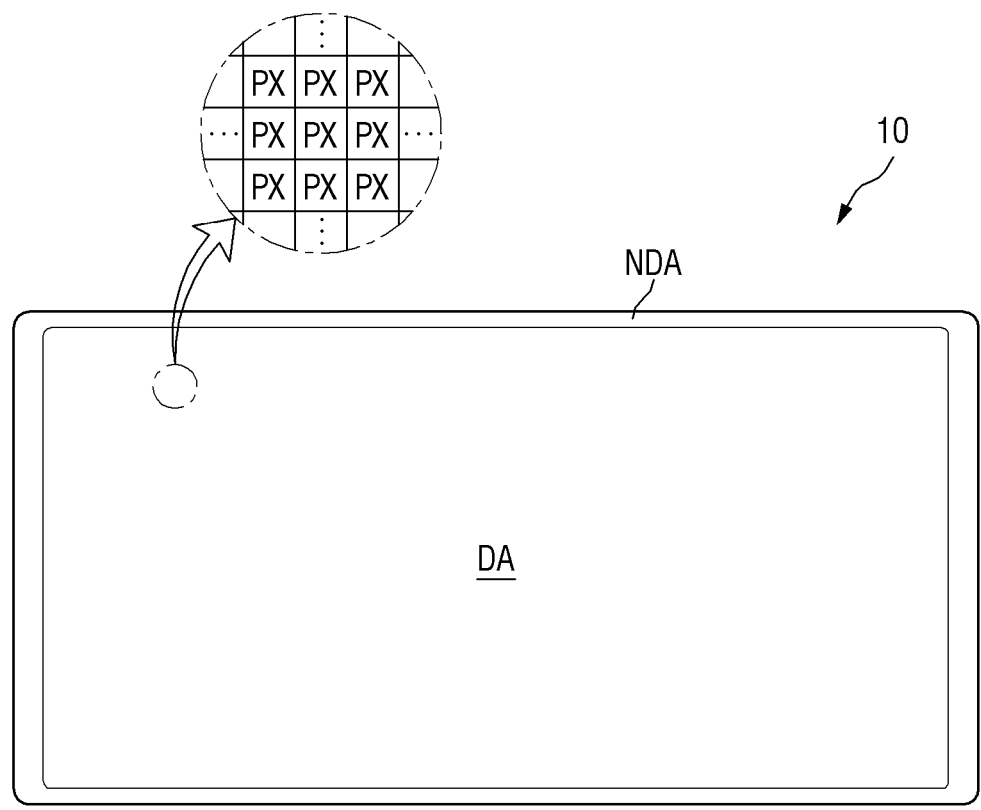
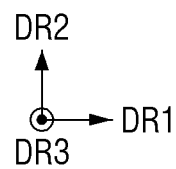

ELECTRODES FOR LIGHT EMITTING ELEMENT OF A DISPLAY DEVICE

CROSS-REFERENCE TO RELATED APPLICATION

This application claims priority to and the benefit of Korean Patent Application No. 10-2019-0139782, filed on Nov. 4, 2019, in the Korean Intellectual Property Office, the disclosure of which is incorporated herein by reference in its entirety.

BACKGROUND

1. Field

The present disclosure relates to a display device.

2. Description of the Related Art

The importance of a display device has increased with the development of multimedia. Accordingly, various types of display devices such as an organic light emitting display (OLED) and a liquid crystal display (LCD) have been used.

A display device is a device for displaying an image, and includes a display panel such as a light emitting display panel or a liquid crystal display panel. Among them, the light emitting display panel may include a light emitting element such as a light emitting diode (LED). In such a case, examples of the light emitting diode (LED) may include an organic light emitting diode (OLED) using an organic material as a fluorescent material and an inorganic light emitting diode using an inorganic material as a fluorescent material.

An inorganic light emitting diode using an inorganic semiconductor as a fluorescent material has durability even in high-temperature environments and has a high efficiency of blue light as compared with an organic light emitting diode. Further, even in the manufacturing process, which has been pointed out as a weakness of a conventional inorganic light emitting diode, a transfer method using dielectrophoresis (DEP) has been developed. Thus, research into inorganic light emitting diodes having high durability and efficiency compared to organic light emitting diodes has been continued.

SUMMARY

According to some example embodiments of the disclosure, a display device includes a substrate, a first electrode and a second electrode spaced from each other on the, a first insulating layer on the first electrode, a first light emitting element located between the first electrode and the second electrode, a second light emitting element on the first insulating layer and spaced from the first light emitting element, and a second insulating layer on the first insulating layer and covering at least a portion of the second light emitting element, wherein the first insulating layer includes at least one first opening penetrating the first insulating layer to expose a portion of the first electrode, the second insulating layer includes at least one second opening penetrating the second insulating layer to expose a portion of the first insulating layer, the first opening and the second opening do not overlap each other in a thickness direction of the substrate, and one end region of the second light emitting element overlaps one of the at least one first opening and the other end region of the second light emitting element overlaps one of the at least one second opening.

In some example embodiments, the first light emitting element and the second light emitting element are electrically connected to the first electrode and the second electrode.

In some example embodiments, the display device further includes a first contact electrode layer interposed between the first electrode and the second insulating layer, wherein the first contact electrode layer includes a first contact electrode contacting one end region of the first light emitting element and the first electrode, and a second contact electrode filling the at least one first opening.

In some example embodiments, the second contact electrode is in contact with one end region of the second light emitting element and the first electrode.

In some example embodiments, the display device includes a third contact electrode contacting the other end region of the first light emitting element and the second electrode.

In some example embodiments, the third contact electrode is in contact with the other end region of the second light emitting element through the at least one second opening.

In some example embodiments, the first contact electrode and the third contact electrode are electrically insulated from each other.

In some example embodiments, the first contact electrode and the second contact electrode are spaced from each other.

In some example embodiments, the display device includes a third light emitting element on the second insulating layer and spaced from the first light emitting element and the second light emitting element, wherein the third light emitting element does not overlap at least one of the at least one first opening and the at least one second opening.

In some example embodiments, the third light emitting element is not electrically connected to at least one of the first electrode or the second electrode.

In some example embodiments, a diameter of the at least one second opening is smaller than a length of the second light emitting element.

According to some example embodiments of the disclosure, a display device includes a substrate, a first electrode and a second electrode spaced from each other on the substrate, a first insulating layer located between the first electrode and the second electrode and on the second electrode, a second insulating layer on the first electrode and having a plurality of first openings exposing at least a portion of the first electrode, a first contact electrode layer on the first electrode exposed by the second insulating layer, a first light emitting element on the first insulating layer, a second light emitting element on the second insulating layer, and a second contact electrode layer on the second electrode and the first contact electrode layer.

In some example embodiments, the first contact electrode layer is in contact with the first electrode, and the second contact electrode layer is in contact with the second electrode.

In some example embodiments, the display device includes a third insulating layer interposed between the first contact electrode layer and the second contact electrode layer.

In some example embodiments, the third insulating layer includes a plurality of second openings penetrating the third insulating layer, and wherein one end region of the second light emitting element overlaps one of the first openings and the other end region of the second light emitting element overlaps one of the second openings.

In some example embodiments, the first contact electrode layer is in contact with one end region of the second light emitting element through the one of the first openings, and the second contact electrode layer is in contact with the other end region of the second light emitting element through the one of the second openings.

In some example embodiments, the second insulating layer is spaced from the first insulating layer In some example embodiments, the first contact electrode layer and the second contact electrode layer are insulated from each other.

In some example embodiments, the first contact electrode layer includes a first contact electrode contacting the first electrode and one end region of the first light emitting element, and a second contact electrode contacting the first electrode and one end region of the second light emitting element.

In some example embodiments, the second contact electrode layer includes a third contact electrode contacting the second electrode, the other end region of the first light emitting element, and the other end region of the second light emitting element.

Aspects of the present disclosure are to provide a display device having high luminance in which an electrode is formed to allow some of light emitting elements on the electrode to emit light.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which:

FIG. 1 is a schematic plan view of a display device, according to some embodiments of the present disclosure;

DETAILED DESCRIPTION

Figure 2:
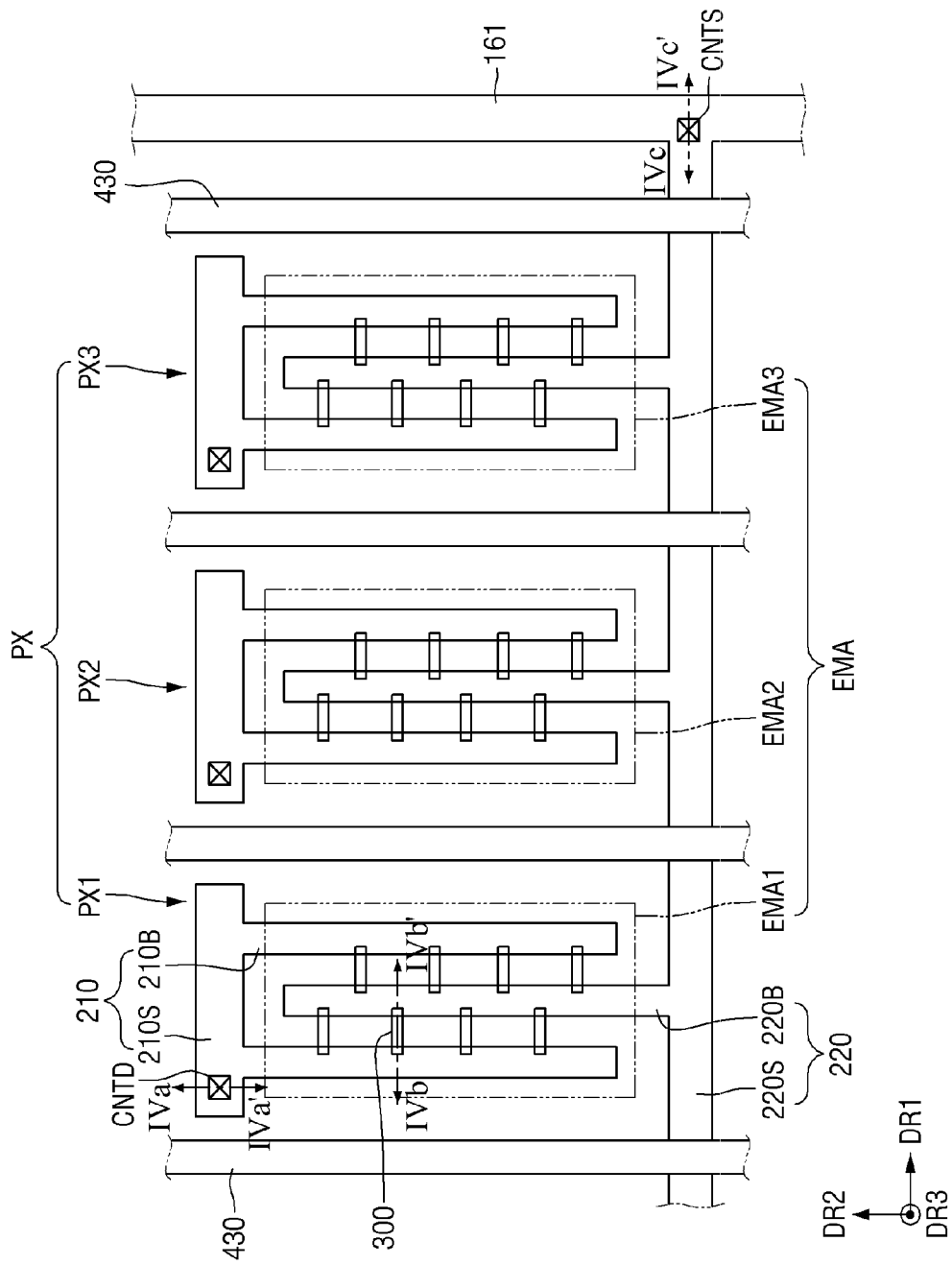
FIG. 2 is a schematic plan view of one pixel of a display device, according to some embodiments of the present disclosure.

Example embodiments of the present disclosure will now be described more fully hereinafter with reference to the accompanying drawings, in which example embodiments of the present disclosure are shown. Example embodiments of the present disclosure may, however, be embodied in different forms and should not be construed as limited to the embodiments set forth herein. Rather, these example embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. When an element is referred to as being "directly on" another element, there are no intervening elements present.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The same reference numerals are used for the same or similar parts throughout the specification.

Hereinafter, embodiments of the present disclosure will be described with reference to the attached drawings.

FIG. 1 is a schematic plan view of a display device, according to some embodiments of the present disclosure.

Referring to FIG. 1, a display device 10 displays a mobile image or a still image. The display device 1 may refer to any electronic device that provides a display screen. Non-limiting examples of the display device 1 may include televisions, notebook computers, monitors, billboards, mobile phones, smart phones, tablet personal computers (tablet PCs), electronic watches, smart watches, watch phones, mobile communication terminals, electronic notebooks, electronic books, portable multimedia players (PMPs), navigators, game machines, digital cameras, and things of internet (IoTs).

The display device 10 includes a display panel for providing a display screen. Non-limiting examples of the display panel may include an LED display panel, an organic light emitting display panel, a quantum dot light emitting display panel, a plasma display panel, and a field emission display panel. Hereinafter, a case where an LED display panel is used as the display panel will be described as an example, but the present disclosure is not limited thereto. Other display panels may be applied as long as the same technical spirit is applicable.

Hereinafter, in the drawings, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 is perpendicular to each of the first direction DR1 and the second direction DR2. In some embodiments, the third direction DR3 represents a thickness direction of the display device 10.

The shape of the display device 10 may be variously modified. For example, the display device 10 may have a rectangular shape in which the first direction DR1 is longer than the second direction DR2. The display surface of the display device 10 may be disposed at one side of the third direction DR3 which is a thickness direction. In some embodiments, unless otherwise mentioned, the upper portion indicates a display direction toward one side of the third direction DR3, and likewise, the upper surface indicates a surface facing one side of the third direction DR3. Further, the lower portion indicates direction opposite to the display direction toward the other side of the third direction DR3, and the lower surface indicates a surface facing the other side of the third direction DR3. However, the present disclosure is not limited thereto, and the display device 10 may have a shape such as a rectangle in which the first direction DR1 is long, a rectangle in which the second direction DR2 is long, a square, a rectangle having rounded corners (vertexes), a polygon, or a circle.

The display device 10 may include a display area DA and a non-display area NDA. The display area DA is an area where an image is displayed, and the non-display area NDA is an area where an image is not displayed. The display area DA may be referred to as an active area, and the non-display area NDA may be referred to as an inactive area.

The shape of the display area DA of the display device 10 may be substantially similar to the shape of the display device 10. For example, when the display device 10 has a rectangular planar shape in which the first direction DR1 is longer than the second direction DR2, the display area DA may also have a rectangular planar shape similar to the rectangular planar shape of the display device 10.

The display area DA may generally occupy the center portion of the display device 10. The display area DA may include a plurality of pixels PX. The plurality of pixels PX may be arranged along matrix directions (e.g., the pixels PX may be arranged in a matrix form). The shape of each pixel PX may be rectangular or square in a plan view, but is not limited thereto. Each pixel PX may also have a rhombus shape, each side thereof being inclined with respect to the first and the second directions DR1 and DR2. The plurality of pixels PX may include various color pixels PX. Each pixel PX may include at least one light emitting element 300 that emits light of a specific wavelength band to display a specific color.

Figure 3:
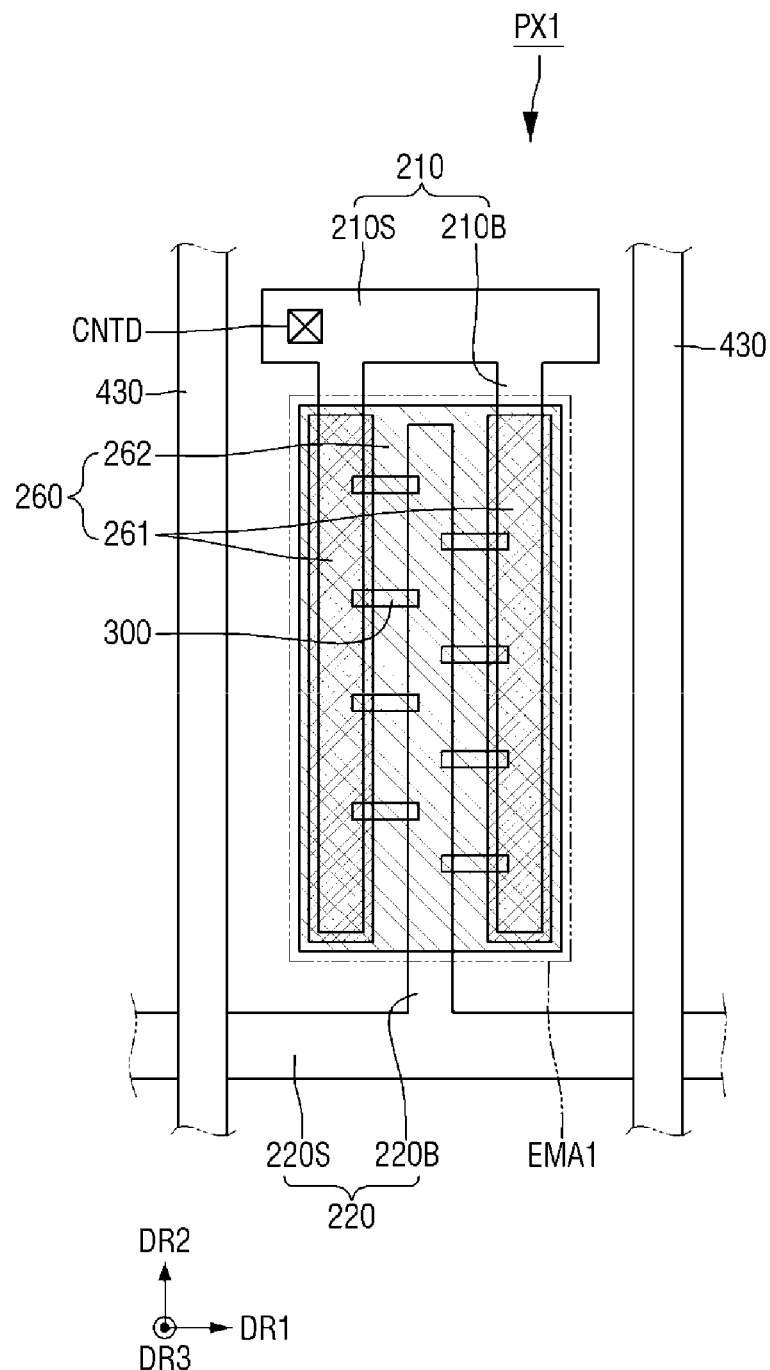
FIG. 3 is a plan view showing one sub-pixel of FIG. 2, according to some embodiments of the present disclosure.

FIG. 2 is a schematic plan view of one pixel of a display device, according to some embodiments of the present disclosure, and FIG. 3 is a plan view showing one sub-pixel of FIG. 2, according to some embodiments of the present disclosure.

Referring to FIGS. 2 and 3, each of the plurality of pixels PX may include a plurality of sub-pixels PXn. For example, each pixel PX may include a first sub-pixel PX1, a second sub-pixel PX2, and a third sub-pixel PX3. Although, in the present example embodiment, each pixel PX includes three sub-pixels PX1, PX2, and PX3, the present disclosure is not limited thereto, and in some embodiments, each pixel PX may include a larger number of sub-pixels PXn.

Each sub-pixel PXn may include at least one light emitting element 300 for emitting light of a specific wavelength band to emit light of a specific color. The first sub-pixel PX1 may emit light of a first color, the second sub-pixel PX2 may emit light of a second color, and the third sub-pixel PX3 may emit light of a third color. The second color of the light emitted from the second sub-pixel PX2 may be different from the first color of the light emitted from the first sub-pixel PX1, and the third color of the light emitted from the third sub-pixel PX3 may be different from the first color of the light emitted from the first sub-pixel PX and the second color of the light emitted from the second sub-pixel PX2. However, the present disclosure is not limited thereto, and the sub-pixels PXn may emit light of the same color. In some example embodiments, the first color of the light emitted from the first sub-pixel PX1 may be blue, second color of the light emitted from the second sub-pixel PX2 may be green, and the third color of the light emitted from the third sub-pixel PX3 may be red, but the present disclosure is not limited thereto.

Each pixel PX may include a light emitting area EMA. The light emitting area EMA may be defined as an area in which the light emitting element 300 included in the display device 10 is disposed to emit light of a specific wavelength band. Each of the plurality of sub-pixels PXn included in each pixel PX may include a sub-light emitting area EMAn. The first sub-pixel PX1 may include a first sub-light emitting area EMA1, the second sub-pixel PX2 may include a second sub-light emitting area EMA2, and the third sub-pixel PX3 may include a third sub-light emitting area EMA3.

The sub-light emitting area EMAn of each sub-pixel PXn may include an area in which the light emitting element 300 is disposed, and an area adjacent to the light emitting element 300, in which the light from the light emitting element 300 is emitted to. The sub-light emitting area EMAn may further include an area in which the light emitted from the light emitting element 300 is reflected or refracted by another member of the display device 10, and each sub-light emitting area EMAn may be formed to include the area in which the light emitting element 300 is disposed and the area adjacent thereto.

The pixel PX of the display device 10 may further include a non-light emitting area. The non-light emitting area of the pixel PX may include a sub-non-light emitting area of each sub-pixel PXn. The non-light emitting area of the pixel PX may be defined as an area other than the light emitting area EMA. The non-light emitting area may be an area in which the light emitting element 300 is not disposed or the light emitted from the light emitting element 300 does not reach and thus no light is emitted.

Each pixel PX may include each sub-pixel PXn and an outer bank 430 disposed between the adjacent sub-pixels PXn. Each sub-pixel PXn of the display device 10 includes a plurality of electrodes 210 and 220, a light emitting element 300, a contact electrode layer 260, an inner bank 410 (e.g., see FIG. 4), and a plurality of insulating layers 510, 520, 530, and 550 (e.g., see FIG. 4).

The plurality of electrodes 210 and 220 may be electrically connected to the light emitting elements 300 to allow the light emitting elements 300 to receive a predetermined (e.g., set) voltage to emit light of a specific wavelength band.

Further, at least some of the plurality of electrodes 210 and 220 may serve to form an electric field in the sub-pixel PXn to align the light emitting elements 300 arranged in the light emitting area EMA of the display device 10.

The plurality of electrodes 210 and 220 may include a first electrode 210 and a second electrode 220. In some example embodiments, the first electrode 210 may be a pixel electrode separated for each sub-pixel PXn, and the second electrode 220 may be a common electrode commonly connected along each sub-pixel PXn. One of the first electrode 210 and the second electrode 220 may be an anode electrode of the light emitting element 300, and the other one thereof may be a cathode electrode of the light emitting element 300. However, the present disclosure is not limited thereto.

The first electrode 210 and the second electrode 220 may include electrode stems 210S and 220S and electrode branches 210B and 220B, respectively. The electrode stems 210S and 220S of the electrodes 210 and 220 may extend in the first direction DR1, and the electrode branches 210B and 220B of the electrodes 210 and 220 may be branched from the electrode stems 210S and 220S and extend in the second direction DR crossing the first direction DR1.

The first electrode 210 may include a first electrode stem 210S and at least one first electrode branch 210B. In some example embodiments, the first electrode 210 may include a first electrode stem 210S and two first electrode branches 210B. As described above, the first electrode stem 210S may extend in the first direction DR1, and each of the first electrode branches 210B may be branched from the first electrode stem 210S and extend from the first electrode stem 210S in a direction opposite to the second direction DR2 (for example, downward direction in the drawings). The two first electrode branches 210B may be spaced from each other in the first direction DR1.

The first electrode stem 210S may be disposed at the upper side (or one side in the second direction DR2) of the sub-pixel PXn. Both ends of the first electrode stem 210S of any one pixel may be spaced from each other in the first direction DR1 and terminated between the adjacent sub-pixels PXn, and may be placed on substantially the same straight line as the first electrode stem 210S of the neighboring sub-pixel PXn at the same row (for example, the first direction DR1). Both ends of the first electrode stem 210S of another sub-pixel PXn may be spaced from each other, and thus different electrical signals from each other may be applied to the first electrode branches of the different sub-pixels PXn. Different electrical signals from each other are applied to the first electrode branches of each sub-pixel PXn, and thus the first electrode branches 210B of another adjacent sub-pixel PXn may be driven separately.

The first electrode branch 210B may be branched from at least a portion of the first electrode stem 210S and extend from the first electrode stem 210S in a direction opposite to the second direction DR2. The first electrode branch 210B may be terminated to be spaced from a second electrode stem 220S described later. The end of the first electrode branch 210B in the extending direction (e.g., opposite to the second direction DR2) may be disposed to be spaced from the second electrode stem 220S.

The second electrode 220 may include a second electrode stem 220S and a second electrode branch 220B. In some example embodiments, the second electrode 220 may include one second electrode branch 220B. As described above, the second electrode stem 220S may extend in the first direction DR1, and the second electrode branches 220B may be branched from the second electrode stem 220S and extend from the second electrode stem 220S in the second direction DR2 (for example, upward direction in the drawings).

The second electrode stem 220S may be spaced from the first electrode stem 210S in the second direction DR2. The second electrode stem 220S may be disposed at the lower side of the sub-pixel PXn (or the other side opposite to one side of the second direction DR2) on a plane. Both ends of the second electrode stem 220S of each sub-pixel PXn may be connected to the second electrode stem 220S of one or more adjacent sub-pixels PXn in the first direction DR1. For example, the second electrode stem 220S, unlike the first electrode stem 210S, may extend in the first direction DR1 to cross the sub-pixels PXn along the first direction DR1. The electrode stem 220S crossing the sub-pixels PXn may be connected to the outer portion of the display area DA in which each pixel PX or the sub-pixels PXn are arranged, or a portion of the non-display area DNA extending in one direction.

The second electrode branch 220B may be branched from at least a portion of the second electrode stem 220S to extend from the second electrode stem 220S in the second direction DR2, and may be terminated to be spaced from the first electrode stem 210S. The end of the second electrode branch 220B in the extending direction (e.g., the second direction DR2) may be disposed to be spaced from the first electrode stem 210S. The second electrode branch 220B may be disposed in a space between the first electrode branches 210B spaced from each other in the first direction DR1. The second electrode branch 220B may be disposed to be spaced from each first electrode branch 210B and face each first electrode branch 210B in the first direction DR1.

Each of the first electrode 210 and the second electrode 220 may be electrically connected to a circuit element layer PAL (e.g., see FIG. 4) of the display device 10 through contact holes, for example, a first electrode contact hole CNTD and a second electrode contact hole CNTS. In some example embodiments, the first electrode contact hole CNTD is formed for each first electrode stem 210S of each sub-pixel PXn and only one second electrode contact hole CNTS is formed in one second electrode stem 220S crossing each sub-pixel PXn. However, the present disclosure is not limited thereto, and in some cases, the second electrode contact hole CNTS may also be formed for each sub-pixel PXn.

Although it is shown in the drawings that the first electrode 210 of each sub-pixel PXn includes two first electrode branches 210B and one second electrode branch 220B is disposed in a space between the two first electrode branches 210B spaced from each other, the present disclosure is not limited thereto. When at least some regions of the first electrode 210 and the second electrode 220 are spaced from each other and face each other to form a space in which the light emitting elements 300 are disposed between the first electrode 210 and the second electrode 220, the structure or shape in which the light emitting elements 300 are arranged is not particularly limited, and the light emitting elements 300 may be arranged in various structures. For example, the first electrode 210 and the second electrode 220 may be partially curved or bent, and one electrode may be disposed to surround the other electrode. In some embodiments, in the first electrode 210 and the second electrode 220, the electrode stems 210S and 220S may be omitted, respectively.

The outer bank 430 may be disposed at a boundary between the sub-pixels PXn. The outer bank 430 may extend in the second direction DR2. The outer bank 430 may be disposed at a boundary between the sub-pixels PXn adjacent to each other in the first direction DR1. The outer bank 430 may extend to another adjacent sub-pixel PXn in the second direction DR2. In some embodiments, the outer bank 430 may extend in the first direction DR1 to be disposed at a boundary between the sub-pixels PXn adjacent to each other in the second direction DR2. The outer bank 430 may be disposed at the boundary of the sub-pixels PXn to distinguish the boundary of the sub-pixels PXn.

The first electrode stem 210S disposed between the outer banks 430 may be spaced from the outer bank 430. Both ends of the first electrode stem 210S of each sub-pixel PXn disposed between the outer banks 430 may be spaced from the outer banks 430, and terminated. The outer banks 430 may include the same material as inner banks 410 and 420 (e.g., see FIG. 4) to be described later, and may be formed concurrently (e.g. simultaneously) in one process.

In the process of manufacturing the display device 10, when an ink, in which the light emitting elements 300 are dispersed, is ejected by an inkjet printing apparatus, the outer bank 430 may perform a function of preventing the ink from overflowing the boundary between the sub-pixels PXn (or reducing the chance of the ink overflowing the boundary between the sub-pixels PXn). The outer bank 430 may separate inks, in which different light emitting elements are dispersed, such that the inks are not mixed with each other.

The light emitting element 300 may be disposed between the first electrode 210 and the second electrode 220. One end region of the light emitting element 300 may be electrically connected to the first electrode 210, and the other end of the light emitting element, which is opposite to the one end region of the light emitting element 300, may be electrically connected to the second electrode 220. Although it is shown in the drawings that both ends of the light emitting element 300 are disposed to at least partially overlap the electrode branches 210B and 220B of the respective electrodes 210 and 220, the present disclosure is not limited thereto. For example, at least one of both ends of the light emitting element 300 may be disposed so as not to overlap the electrode branches 210B and 220B of the respective electrodes 210 and 220. Even in this case, the light emitting element 300 may be electrically connected to each of the first electrode 210 and the second electrode 220 through a contact electrode layer 260 to be described later.

The plurality of light emitting elements 300 may be spaced from each other and aligned substantially parallel to each other. The distance between the light emitting elements spaced from each other is not particularly limited. In some cases, some light emitting elements 300 may be arranged adjacent to each other to form a group, other light emitting elements 300 may be arranged to be spaced from each other at regular intervals to form a group, and the light emitting elements 300 may be aligned with each other in a non-uniform density. In some example embodiments, the light emitting element 300 may have a shape extending in one direction, and the extending direction of each of the electrodes, for example, each of the first electrode branch 210B and the second electrode branch 220B, may be substantially perpendicular to the extending direction of the light emitting element 300. However, the present disclosure is not limited thereto, and the light emitting element 300 may be disposed obliquely in the extending direction of the first electrode branch 210B and the second electrode branch 220B, without being perpendicular to the extending direction (e.g., the second direction DR2 or a direction opposite to the second direction DR2) of the first electrode branch 210B and the second electrode branch 220B.

The light emitting element 300 may include an active layer 330 (e.g., see FIGS. 5 and 6) to be described later. The light emitting element 300 may emit light of a specific wavelength band to the outside depending on a material included in the active layer 330 (e.g., see FIGS. 5 and 6). When the light emitting elements 300 include active layers 330 (e.g., see FIGS. 5 and 6) including different materials from each other, respectively, the respective light emitting elements 300 may emit light of different wavelength bands to the outside.

The display device 10 according to some embodiments may include light emitting elements 300 that emit light of different wavelength bands. The light emitting element 300 of the first sub-pixel PX1 may include an active layer 330 that emits first color light L1 of a first wavelength band as a center wavelength band, the light emitting element 300 of the second sub-pixel PX2 may include an active layer 330 that emits second color light L2 of a second wavelength band as a center wavelength band, and the light emitting element 300 of the third sub-pixel PX3 may include an active layer 330 that emits third color light L3 of a third wavelength band as a center wavelength band. The light emitting elements 300 disposed in the sub-pixels PX1, PX2, and PX3, respectively, may have the same structure, but may include active layers 330 that emit different color lights.

Thus, the first color light L1 may be emitted from the first sub-pixel PX1, the second color light L2 may be emitted from the second sub-pixel PX2, and the third color light L3 may be emitted from the third sub-pixel PX3. In some example embodiments, the first color light L1 may be blue light having a center wavelength band ranging from 450 nm to 495 nm, and the second color light L2 may be green light having a center wavelength band ranging from 495 nm to 570 nm, and the third color light L3 may be red light having a center wavelength band ranging from 620 nm to 752 nm. However, the present disclosure is not limited thereto, and the first color light L1, the second color light L2, and the third color light L3 may be light of colors different from the example colors, and may be light of the same colors as the example colors whereas the ranges of the center wavelength bands may be different from each other. Further, in some cases, the first sub-pixel PX1, the second sub-pixel PX2, and the third sub-pixel PX3 may include light emitting elements 300 of the same type to emit light of substantially the same color.

In some embodiments, in FIGS. 2 and 3, the display device 10 may include a first insulating layer 510 (e.g., see FIG. 4) disposed between the first electrode 210 and the second electrode 220.

The first insulating layer 510 may be disposed in each sub-pixel PXn of the display device 10. The first insulating layer 510 may also extend to other neighboring sub-pixels PXn. In some embodiments, in FIGS. 2 and 3, the first insulating layer 510 is disposed between the first electrode 210 and the second electrode 220, for example, between the first electrode branch 210B and the second electrode branch 220B, to expose at least some regions of the first electrode branch 210B and the second electrode branch 220B.

Referring to FIG. 3, the contact electrode layer 260 may include a first contact electrode layer 261 and a second contact electrode layer 262. The first contact electrode layer 261 may be disposed on the first electrode 210, and the second contact electrode layer 262 may be entirely disposed on the first electrode 210 and the second electrode 220.

Each of the contact electrode layers 261 and 262 may have a shape in which at least a portion thereof extends in one direction. The plurality of contact electrode layers 260 may contact the light emitting element 300 and the plurality of electrodes 210 and 220, respectively. The light emitting elements 300 may be electrically connected to the first electrode 210 and the second electrode 220 through the contact electrode layers 260 to receive electrical signals from the first electrode 210 and the second electrode 220.

The first contact electrode layer 261 may be disposed on the first electrode 210, for example, on the first electrode branch 210B and extend in the second direction DR2. The first contact electrode layer 261 may be disposed to overlap at least a portion of the first electrode branch 210B in the thickness direction. The first contact electrode layer 261 may contact one end region of the light emitting element 300. Further, the first contact electrode layer 261 may contact at least a portion of the first electrode 210 exposed by a second insulating layer 520 (e.g., see FIG. 4) described later. Thus, the light emitting element 300 may be electrically connected to the first electrode 210 through the first contact electrode layer 261.

The second contact electrode layer 262 may be disposed on the first electrode 210 and the second electrode 220, for example, on the first electrode branch 210B and the second electrode branch 220B and extend in the second direction DR2. The second contact electrode layer 262 may be disposed to overlap at least a portion of the first electrode branch 210B and at least a portion of the second electrode branch 220B in the thickness direction. The second contact electrode layer 262 may overlap the first contact electrode layer 261 on the first electrode branch 210B in the third direction DR3, and may not overlap the first contact electrode layer 261 on the second electrode branch 220B in the third direction DR3. The second contact electrode layer 262 may contact the other end of the light emitting element 300 disposed between the first electrode branch 210B and the second electrode branch 220B in an area not overlapping the first contact electrode layer 261. Further, the second contact electrode layer 262 may contact at least a portion of the second electrode 220 exposed by the first insulating layer 510. Thus, the light emitting element 300 may be electrically connected to the second electrode 220 through the second contact electrode layer 262.

In some example embodiments, one sub-pixel PXn may include two first electrode branches 210B and one second electrode branch 220B, and the first contact electrode layers 261 respectively disposed on the two first electrode branches 210B may be spaced from each other.

A third insulating layer 530, which will be described later, may be disposed between the second contact electrode layer 262 and the first contact electrode layer 261, disposed on the two first electrode branches 210B and the one second electrode branch 220B of one sub-pixel PXn, and thus the second contact electrode layer 262 and the first contact electrode layer 261 may be insulated from each other. Meanwhile, the number of first contact electrode layers 261 and second contact electrode layers 262 may vary according to the number of first electrode branches 210B and second electrode branches 220B included in one sub-pixel PXn.

In some embodiments, the width of the first contact electrode layer 261 in the first direction DR1 may be greater than the width of the first electrode 210, for example, the first electrode branch 210B the first direction DR1. In detail, the first contact electrode layer 261 may be disposed to cover the both sides of the first electrode branch 210B and extend outwardly.

The width of the second contact electrode layer 262 the first direction DR1 may be greater than the sum of widths of the first electrode 210 and the second electrode 220, for example, the first electrode branch 210B and the second electrode branch 220B in the first direction DR1. The second contact electrode layer 262 may be disposed to completely cover the two first contact electrode layers 261 spaced from each other.

Although each light emitting element 300 is physically spaced from the first electrode branch 210B and the second electrode branch 220B, the first contact electrode layer 261 and the second contact electrode layer 262 cover a portion of the first electrode branch 210B and a portion of the second electrode branch 220B and extend outwardly to contact at least a portion of each light emitting element 300, thereby electrically connecting the plurality of electrodes 210 and 220 and the light emitting element 300.

Figure 4:
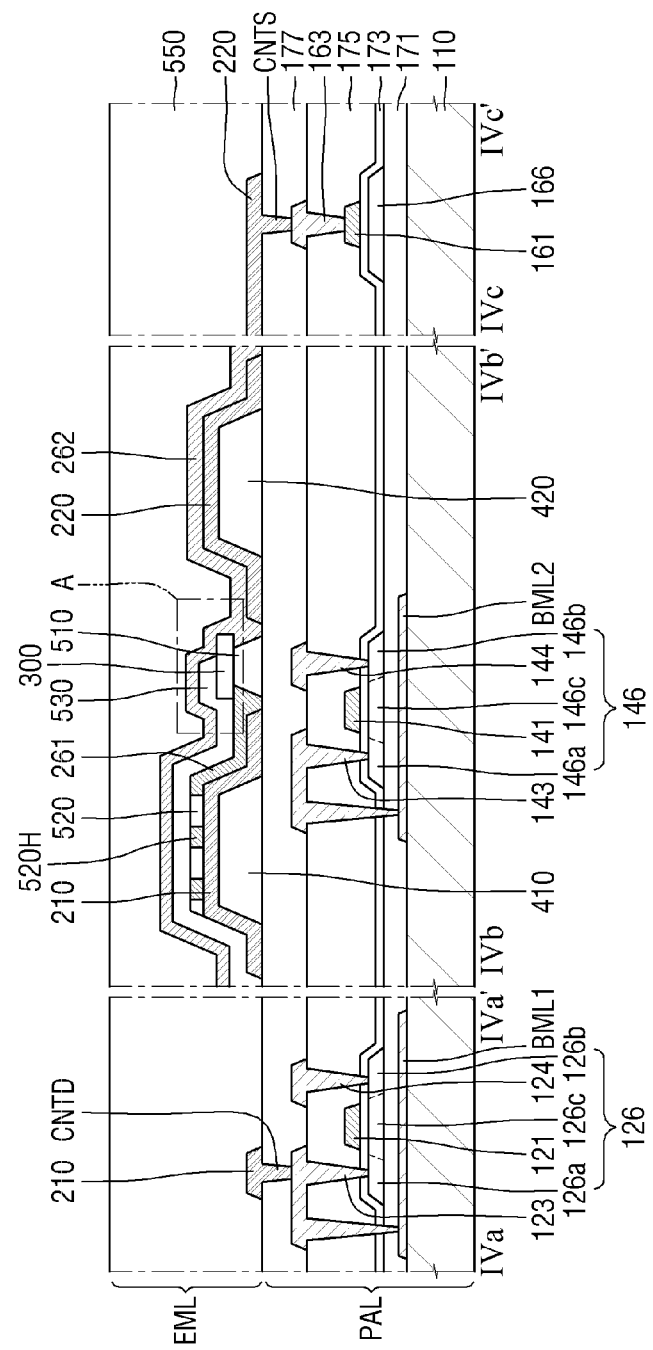
FIG. 4 is a cross-sectional view taken along the lines IVa-IVa', IVb-IVb', and IVc-IVc' in FIG. 2, according to some embodiments of the present disclosure.
Figure 5:
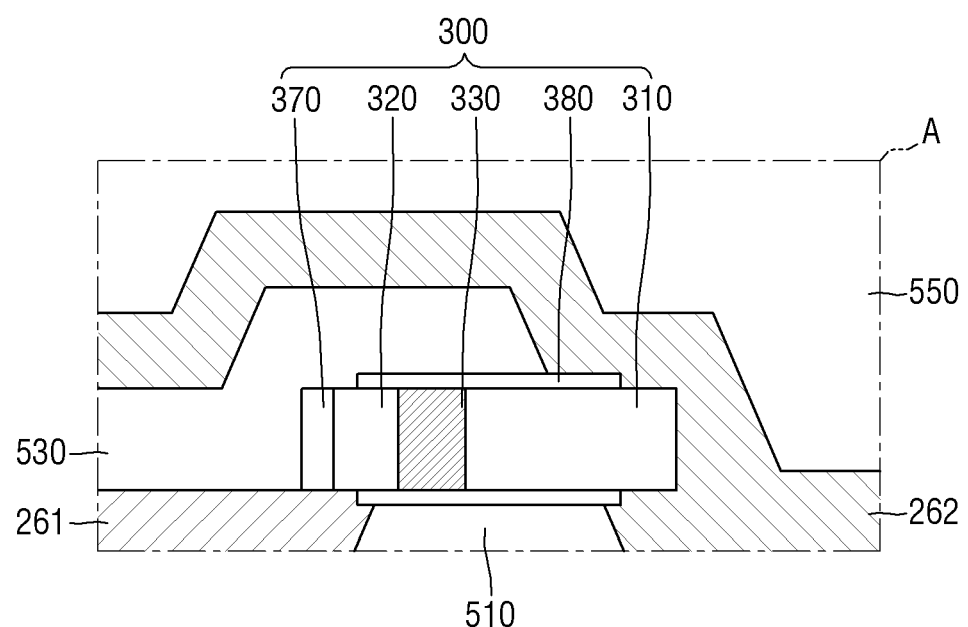
FIG. 5 is an enlarged view of the portion A in FIG. 4, according to some embodiments of the present disclosure.
Figure 6:
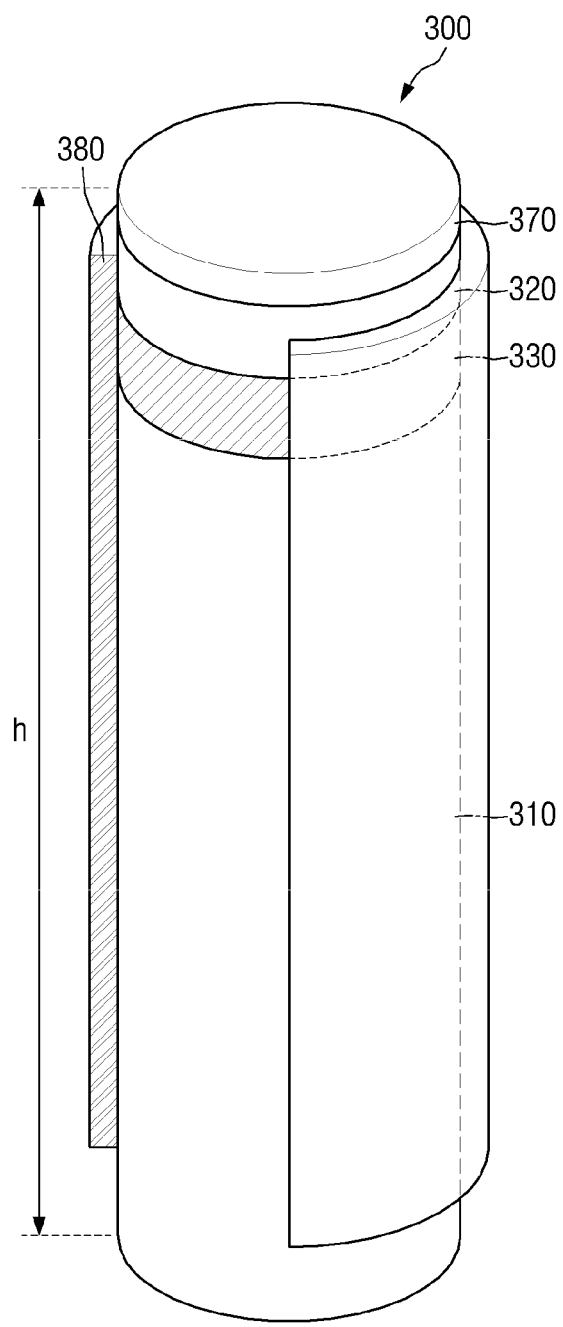
FIG. 6 is a schematic view of a light emitting element, according to some embodiments of the present disclosure.

FIG. 4 is a cross-sectional view taken along the lines IVa-IVa', IVb-IVb', and IVc-IVc' in FIG. 2, according to some embodiments of the present disclosure, FIG. 5 is an enlarged view of the portion "A" in FIG. 4, according to some embodiments of the present disclosure, and FIG. 6 is a schematic view of a light emitting element, according to some embodiments of the present disclosure.

FIG. 4 illustrates only a cross section of the first sub-pixel PX1, but may be similarly applied to other pixels PX or other sub-pixels PXn. FIG. 4 illustrates a cross section that crosses one end region and the other end of the light emitting element 300 disposed in the first sub-pixel PX1.

Referring to FIG. 4 together with FIGS. 2 and 3, the display device 10 may include a circuit element layer PAL and a light emitting layer EML disposed on the circuit element layer PAL. The circuit element layer PAL may include a substrate 110, a light blocking layer BML, a buffer layer 171, a first transistor 120, and a second transistor 140. The light emitting layer EML may include a plurality of electrodes 210 and 220, a light emitting element 300, a plurality of inner banks 410 and 420, and a plurality of insulating layers 510, 520, 530, and 550, which are disposed on first and second transistors 120 and 140.

The substrate 110 may be an insulating substrate. The substrate 110 may include an insulating material such as glass, quartz, or polymer resin. The substrate 110 may be a rigid substrate, but may be a flexible substrate capable of warping, bending, folding, or rolling.

A light blocking layer BML may be disposed on the substrate 110. The light blocking layer BML may include a first light blocking layer BML1 and a second light blocking layer BML2. The first light blocking layer BML1 may be electrically connected to a first source-drain electrode 123 of the first transistor 120 to be described later, and the second light blocking layer BML2 may be electrically connected to the first source-drain electrode 143 of the second transistor 140. In some embodiments, the first source-drain electrodes 123 and 143 of the first and second transistors 120 and 140 may be drain electrodes, but the present disclosure is not limited thereto, and vice versa.

The first light blocking layer BML1 and the second light blocking layer BML2 are arranged to overlap a first active material layer 126 of the first transistor 120 and a second active material layer 146 of the second transistor 140 in the thickness direction, respectively. The width of the first light blocking layer BML1 may be greater than the width of the first active material layer 126 of the first transistor 120 disposed on the first light blocking layer BML1. Similarly, the width of the second light blocking layer BML2 may be greater than the width of the second active material layer 146 disposed on the second light blocking layer BML2. The first and second light blocking layers BML1 and BML2 may include a material that blocks light, thereby preventing light from (or reducing the chance of light) being incident on the first and second active material layers 126 and 146. For example, the first and second light blocking layers BML1 and BML2 may be formed of an opaque metal material that blocks or substantially reduces the transmission of light. However, the present disclosure is not limited thereto, and in some cases, the light blocking layer BML may be omitted.

A buffer layer 171 is disposed on the light blocking layer BML and the substrate 110 exposed by the light blocking layer BML. The buffer layer 171 may be disposed to cover the entire surface of the substrate 110 including the light blocking layer BML. A plurality of contact holes may be formed in the buffer layer 171 to expose a portion of the first light blocking layer BML1 and a portion of the second light blocking layer BML2 through the buffer layer 171.

The buffer layer 171 may prevent or reduce the diffusion of impurity ions, prevent or reduce the penetration of moisture or external air, and perform a surface planarization function. Further, the buffer layer 171 may insulate the light blocking layer BML and the first and second active material layers 126 and 146 from each other.

A semiconductor layer is disposed on the buffer layer 171. The semiconductor layer may include a first active material layer 126 of the first transistor 120, a second active material layer 146 of the second transistor 140, and an auxiliary layer 166. The semiconductor layer may include polycrystalline silicon, monocrystalline silicon, oxide semiconductor, or the like.

The first active material layer 126 may include a first doped region 126a, a second doped region 126b, and a first channel region 126c. The first channel region 126c may be disposed between the first doped region 126a and the second doped region 126b. The second active material layer 146 may include a third doped region 146a, a fourth doped region 146b, and a second channel region 146c. The second channel region 146c may be disposed between the third doped region 146a and the fourth doped region 146b.

The first active material layer 126 and the second active material layer 146 may include polycrystalline silicon. Polycrystalline silicon may be formed by crystallizing amorphous silicon. Non-limiting examples of the crystallizing methods may include, but are not limited to, rapid thermal annealing (RTA), solid phase crystallization (SPC), excimer laser annealing (ELA), metal induced crystallization (MILC), and sequential lateral solidification (SLS). As another example, the first active material layer 126 and the second active material layer 146 may include monocrystalline silicon, low-temperature polycrystalline silicon, amorphous silicon, or the like. The first doped region 126a, the second doped region 126b, the third doped region 146a, and the fourth doped region 146b may be regions in which a portion of the first active material layer 126 and a portion of the second active material layer 146 are doped with impurities.

The first active material layer 126 and the second active material layer 146 are not necessarily limited to those described above. For example, the first active material layer 126 and the second active material layer 146 may include an oxide semiconductor. In this case, the first doped region 126a and the third doped region 146a may be first conductive regions, and the second doped region 126b and the fourth doped region 146b may be second conductive regions. When the first active material layer 126 and the second active material layer 146 include an oxide semiconductor, the oxide semiconductor may be an oxide semiconductor containing indium (In). In some embodiments, examples of the oxide semiconductor may include, but are not limited to, Indium-Tin Oxide (ITO), Indium-Zinc Oxide (IZO), Indium-Galium Oxide (IGO), Indium-Zinc-Tin Oxide (IZTO), Indium-Galium-Tin Oxide (IGTO), and Indium-Galium-Zinc-Tin Oxide (IGZTO).

A gate insulating film 173 is disposed on the semiconductor layer and the buffer layer 171 exposed by the semiconductor layer (e.g., 126, 146, and 166). The gate insulating film 173 may be disposed to entirely cover the buffer layer 171 and the semiconductor layer (e.g., 126, 146, and 166).

A plurality of contact holes may be formed in the gate insulating film 173. The plurality of contact holes formed in the gate insulating film 173 may include a first contact hole and a second contact hole. The first contact hole formed in the gate insulating film 173 may penetrate the gate insulating film 173 to expose a portion of the first active material layer 126 and a portion of the second active material layer 146. For example. in some embodiments, the first contact hole may include four contact holes, where two of the four contact holes of the first contact hole expose a portion of the first active material layer 126 (e.g., 126a, 126b) and the other two contact holes of the first contact hole expose a portion of the second active material layer 146 (e.g., 146a, 146b). The second contact hole formed in the gate insulating film 173 may penetrate the gate insulating film 173 and the buffer layer 171 to expose a portion of the first light blocking layer BML1 and a portion of the second light blocking layer BML2. For example, in some embodiments, the second contact hole may include two contact holes, where one of the two contact holes of the second contact hole exposes a portion of the first light blocking layer BML1 and the other contact hole of the second contact hole exposes a portion of the second light blocking layer BML2.

The gate insulating film 173 may include a silicon compound, a metal oxide, or the like. For example, the gate insulating film 173 may include silicon oxide, silicon nitride, silicon oxynitride, aluminum oxide, tantalum oxide, hafnium oxide, zirconium oxide, or titanium oxide. These oxides may be used alone or in combination with each other. The gate insulating film 173 may be a single-layer film or a multi-layer layer film formed of a stacked layer of different materials.

A first conductive layer is disposed on the gate insulating film 173. The first conductive layer may include a first gate electrode 121 disposed on the first active material layer 126, a second gate electrode 141 disposed on the second active material layer 146, and a power supply line 161 disposed on the auxiliary layer 166. The first gate electrode 121 may be disposed on the gate insulating film 173 to overlap the first channel region 126c of the first active material layer 126 in the thickness direction, the second gate electrode 141 may be disposed on the gate insulating film 173 to overlap the second channel region 146c of the second active material layer 146 in the thickness direction, and the power supply line 161 may be disposed on the auxiliary layer 166 to overlap the auxiliary layer in the thickness direction.

An interlayer insulating film 175 is disposed on the first conductive layer. The interlayer insulating film 175 may function as an insulating film between the first conductive layer and another layer disposed thereon. The interlayer insulating film 175 may include an organic insulating material and perform a surface planarization function.

A second conductive layer is disposed on the interlayer insulating film 175. The second conductive layer includes a first source-drain electrode 123 of the first transistor 120, a second source-drain electrode 124 of the first transistor 120, a first source-drain electrode 143 of the second transistor 140, a second source-drain electrode 144 of the second transistor 140, and a power supply electrode 163.

The first source-drain electrode 123 of the first transistor 120 may be in contact with the first doped region 126a of the first active material layer 126 through a contact hole penetrating the interlayer insulating film 175 and the gate insulating film 173, and the first source-drain electrode 123 of the first transistor 120 may be in contact with the first light blocking layer BML1 through a contact hole penetrating the interlayer insulating film 175, the gate insulating film 173, and the buffer layer 171.

The second source-drain electrode 124 of the first transistor 120 may be in contact with the second doped region 126b of the first active material layer 126 through a contact hole penetrating the interlayer insulating film 175 and the gate insulating film 173.

The first source-drain electrode 123 of the first transistor 120 and the second source-drain electrode 124 of the first transistor 120 may be spaced from each other and disposed at the interlayer insulating film 175.

The first source-drain electrode 143 of the second transistor 140 may be in contact with the third doped region 146a of the second active material layer 146 through a contact hole penetrating the interlayer insulating film 175 and the gate insulating film 173, and the first source-drain electrode 143 of the second transistor 140 may be in contact with the second light blocking layer BML2 through a contact hole penetrating the interlayer insulating film 175, the gate insulating film 173, and the buffer layer 171.

The second source-drain electrode 144 of the second transistor 140 may be in contact with the fourth doped region 146b of the second active material layer 146 through a contact hole penetrating the interlayer insulating film 175 and the gate insulating film 173.

The first source-drain electrode 143 of the second transistor 140 and the second source-drain electrode 144 of the second transistor 140 may be spaced from each other and disposed at the interlayer insulating film 175.

The first source-drain electrode 123 of the first transistor 120 and the first source-drain electrode 143 of the second transistor 140 may be in contact with the upper surfaces of the first light blocking layer BML1 and the second light blocking layer BML2, respectively, through a plurality of contact holes to be electrically connected to the first light blocking layer BML1 and the second light blocking layer BML2.

The power supply electrode 163 is disposed on the power supply line 161. The power supply electrode 163 may be disposed on the power supply line 161 so as to overlap in the thickness direction. The power supply electrode 163 may be in contact with the upper surface of the power supply line 161 through a contact hole penetrating the interlayer insulating film 175 to be electrically connected to the power supply line 161.

A via layer 177 is disposed on the second conductive layer. The via layer 177 may be provided with a first electrode contact hole CNTD and a second electrode contact hole CNTS which penetrate the via layer 177. The via layer 177 may include an organic insulating material to perform a surface planarization function.

A plurality of inner banks 410 and 420, an outer bank 430 (e.g., see FIG. 3), a plurality of electrodes 210 and 220, and a light emitting element 300 may be arranged on the via layer 177.

The plurality of inner banks 410 and 420 may include a first inner bank 410 and a second inner bank 420. The first inner bank 410 and the second inner bank 420 may be disposed adjacent to the center of each sub-pixel PXn. The first inner bank 410 and the second inner bank 420 are spaced from each other and face each other.

The first inner bank 410 and the second inner bank 420 may extend in the second direction DR2 in each sub-pixel PXn. In some embodiments, as the first inner bank 410 and the second inner bank 420 extend in the second direction DR2, the first inner bank 410 and the second inner bank 420 may extend toward the neighboring sub-pixel PXn in the second direction DR2. However, the present disclosure is not limited thereto, and the first inner bank 410 and the second inner bank 420 may be disposed for each sub-pixel PXn to form a pattern on the entire surface of the display device 10. The plurality of inner banks 410 and 420 and the aforementioned outer bank 430 may include polyimide (PI), but the material thereof is not limited thereto.

The first inner bank 410 and the second inner bank 420 may have a structure in which at least a portion thereof protrudes from the via layer 177. The first inner bank 410 and the second inner bank 420 may protrude upward from a plane where the light emitting element 300 is disposed. The protruding shapes of the first inner bank 410 and the second inner bank 420 are not particularly limited.

In some example embodiments, each of the first and second inner banks 410 and 420 may include an upper surface, a lower surface, and a side surface. The upper and lower surfaces of the first inner bank 410 face each other. Each of the upper and lower surfaces of the first inner bank 410 is located on one plane, and the plane where the upper surface of the first inner bank 410 is located and the plane where the lower surface thereof is located are substantially parallel, so that the first inner bank 410 may have an entirely uniform (e.g., substantially uniform) thickness. The lower surface of the first inner bank 410 is placed on one surface of the via layer 177. Similarly, the upper and lower surfaces of the second inner bank 420 face each other. Each of the upper and lower surfaces of the first inner bank 410 is located on one plane, and the plane where the upper surface of the second inner bank 420 is located and the plane where the lower surface thereof is located are substantially parallel, so that the second inner bank 420 may have an entirely uniform (e.g., substantially uniform) thickness. The lower surface of the second inner bank 420 is placed on one surface of the via layer 177.

In some embodiments, the width of the upper surface of each of the inner banks 410 and 420 may be different from the width of the lower surface of each of the inner banks 410 and 420. For example, the plane where the side surface of each of the inner banks 410 and 420 is located may be inclined at an acute angle with respect to one surface of the via layer 177, and in some embodiments, the widths of the upper surfaces of the inner banks 410 and 420 may be smaller than the widths of the lower surfaces of the inner banks 410 and 420. Although it is shown in the drawings that the shape and size of the first inner bank 410 are the same as the shape and size of the second inner bank 420, the present disclosure is not limited thereto, and the shape and size of the first inner bank 410 may be different from the shape and size of the second inner bank 420.

As described above, because each of the inner banks 410 and 420 protrudes from the via layer 177 to have an inclined side surface, the light traveling to the inclined side surface of each of the inner banks 410 and 420, of the light emitted from the light emitting element 300, may be reflected from the inclined side surface of each of the inner banks 410 and 420. As will be described later, when the electrodes 210 and 220 disposed on the respective inner banks 410 and 420 include a material having high reflectance, the light emitted from the light emitting element 300 may be reflected by the electrodes 210 and 220 located on the inclined side surfaces of the respective inner banks 410 and 420, and may travel in the upward direction of the via layer 177.

As described above, the inner banks 410 and 420 and the outer bank 430 may be formed of the same material in the same process. However, the outer bank 430 is formed at the boundary between the adjacent sub-pixels PXn to form a lattice pattern, whereas the inner banks 410 and 420 are arranged in each of the sub-pixels PXn to extend in one direction. Although the outer bank 430 distinguishes neighboring sub-pixels PXn and prevents ink from (or reduces the chance of ink) overflowing to adjacent sub-pixels PXn in an inkjet process, each of the inner banks 410 and 420 has a protruding structure in each sub-pixel PXn to reflect the light emitted from the light emitting element 300 and being directed toward the side surface of each of the inner banks 410 and 420 in order for the reflected light to travel in the upward direction from the via layer 177. For example, the first and second inner banks 410 and 420 may function as reflective partition walls that reflect the light emitted from the light emitting element 300.

The plurality of electrodes 210 and 220 may be disposed on the via layer 177 and the inner banks 410 and 420. Some regions of the first electrode 210 and the second electrode 220 may be disposed on the via layer 177, and other regions of the first electrode 210 and the second electrode 220 may be disposed on the inner banks 410 and 420.

As described above, the electrodes 210 and 220 include the electrode stems 210S and 220S and the electrode branches 210B and 220B, respectively. The line IVa-IVa' in FIG. 2 is a line crossing the first electrode stem 210S, the IVb-IVb' line in FIG. 2 is a line crossing the first electrode branch 210B and the second electrode branch 220B of the first sub-light emitting area EMA1, and the line IVc-IVc' in FIG. 2 is a line crossing the second electrode stem 220S. For example, it may be understood that the first electrode 210 disposed in the region IVa-IVa' of FIG. 4 is the first electrode stem 210S, the first electrode 210 and the second electrode 220 disposed in the region IVb-IVb' of FIG. 4 are the first electrode branch 210B and the second electrode branch 220B, respectively, and the second electrode 220 disposed in the region IVc-IVc' of FIG. 4 is the second electrode stem 220S. The electrode stems 210S and 220S and the electrode branches 210B and 220B may form the first electrode 210 and the second electrode 220, respectively. Hereinafter, for convenience of explanation, it will be described that the first electrode stem 210S and the first electrode branch 210B refer to the first electrodes 210, and the second electrode stem 220S and the second electrode branch 220B refer to the second electrodes 220.

The first electrode 210 disposed in the region IVa-IVa' of FIG. 4, for example, the first electrode stem 210S, may be in contact with the first source-drain electrode 123 of the first transistor 120 through the first electrode contact hole CNTD formed to penetrate the via layer 177 to expose at least a portion of the first source-drain electrode 123 of the first transistor 120. The first electrode 210 may be electrically connected to the first source-drain electrode 123 of the first transistor 120 to receive an electrical signal (e.g., a predetermined or set eletrical signal) predetermined electrical signal.

The second electrode 220 disposed in the region IVc-IVc' of FIG. 4 may extend in one direction to be disposed in a non-light emitting area in which the light emitting elements 300 are not arranged. For example, the second electrode stem 220S may be in contact with the power supply electrode 163 through the second electrode contact hole CNTS formed to penetrate the via layer 177 to expose at least a portion of the power supply electrode 163. The first electrode 210 may be electrically connected to the power supply electrode 163 to receive an electrical signal (e.g., a predetermined or set electrical signal).

The plurality of electrodes 210 and 220 disposed in the region IVb-IVb' of FIG. 4 may be arranged on the inner banks 410 and 420. The first electrode 210 may be disposed on the first inner bank 410, and the second electrode 220 may be disposed on the second inner bank 420. For example, the first electrode branch 210B may be disposed on the first inner bank 410, and the second electrode branch 220B may be disposed on the second inner bank 420.

The number of first inner banks 410 disposed in one sub-pixel PXn is equal (e.g., substantially equal) to the number of first electrode branches 210B of the first electrode 210, and the number of second inner banks 420 may be equal (e.g., substantially equal) to the number of second electrode branches 220B of the second electrode 220. For example, when the number of first electrode branches 210B included in one sub-pixel PXn is two and the number of second electrode branches 220B is one, the number of first inner banks 410 included in one sub-pixel PXn may be two, and the number of second inner banks 420 may be one. However, the present disclosure is not limited thereto, and the number of the first inner banks 410 and the number of the second inner banks 420 may be larger than the number of the first electrode branches 210B and the number of the second electrode branches 220B, respectively.

The first electrode 210 disposed on the first inner bank 410 may be disposed to entirely cover the upper surface and both side surfaces of the first inner bank 410. The first electrode 210 may entirely cover both side surfaces of the first inner bank 410, and may extend outward to cover at least a portion of the via layer 177 exposed by the first inner bank 410 and the second inner bank 420.

The second electrode 220 disposed on the second inner bank 420 may be disposed to entirely cover the upper surface and both side surfaces of the second inner bank 420. The second electrode 220 may entirely cover both side surfaces of the second inner bank 420, and may extend outwards to cover at least a portion of the via layer 177 exposed by the first inner bank 410 and the second inner bank 420.

The first inner bank 410 and the second inner bank 420 may be spaced from each other at the center of each sub-pixel PXn, and the first electrode 210 and the second electrode 220 disposed on the inner banks 410 and 420 may also be spaced from each other. For example, the first electrode 210 and the second electrode 220, which are disposed on the first inner bank 410 and the second inner bank 420 and extends outwards to be disposed on portion of the via layer 177 exposed by the first inner bank 410 and the second inner bank 420, may be spaced from each other. The plurality of light emitting elements 300 may be arranged in an area between the first electrode 210 and the second electrode 220, for example, a space in which the first electrode branch 210B and the second electrode branch 220B are spaced from each other and face each other.

Each of the electrodes 210 and 220 may include a transparent conductive material. For example, each of the electrodes 210 and 220 may include a material such as indium tin oxide (ITO), indium zinc oxide (IZO), or indium tin-zinc oxide (ITZO), but the material thereof is not limited thereto. In some embodiments, each of the electrodes 210 and 220 may include a high-reflectance conductive material. For example, each of the electrodes 210 and 220 may include a metal such as silver (Ag), copper (Cu), or aluminum (Al) as the high-reflectance conductive material. In some embodiments, each of the electrodes 210 and 220 may reflect the light emitted from the light emitting element 300 and incident on each of the electrodes 210 and 220, and may emit (or direct) the reflected light in the upward direction of each sub-pixel PXn.

Each of the electrodes 210 and 220 may have a laminate structure in which one or more transparent conductive material layer and one or more high-reflectance metal layers are laminated, or may be formed as a single-layer structure including these layers. In some example embodiments, each of the electrodes 210 and 220 may have a laminated structure of ITO/silver (Ag)/ITO/IZO, or may be formed of an alloy including aluminum (Al), nickel (Ni), and lanthanum (La). However, the present disclosure is not limited thereto.

A first insulating layer 510 is disposed between the first electrode 210 and the second electrode 220. The first insulating layer 510 may be disposed on the via layer 177 exposed by the first electrode 210 and the second electrode 220. The first insulating layer 510 disposed between the first electrode 210 and the second electrode 220 may be spaced from and face each of the first electrode 210 and the second electrode 220. However, the present disclosure is not limited thereto, and the first insulating layer 510 may be disposed to overlap at least a portion of the second electrode 220.

The first insulating layer 510 may extend in the second direction DR2 in each sub-pixel PXn. In some embodiments, as the first insulating layer 510 extends in the second direction DR2, the first insulating layer 510 may extend toward the neighboring sub-pixel PXn in the second direction DR2. However, the present disclosure is not limited thereto, and the first insulating layer 510 may be disposed for each sub-pixel PXn to form a pattern on the entire surface of the display device 10.

The first insulating layer 510 may have a structure in which at least a portion of the first insulating layer 510 protrudes from the via layer 177. The first insulating layer 510 may protrude upward from the plane where the light emitting element 300 is disposed. The protruding shape of the first insulating layer 510 is not particularly limited.

The first insulating layer 510 may include an upper surface, a lower surface, and side surfaces. The upper and lower surfaces of the first insulating layer 510 face each other. Each of the upper and lower surfaces of the first insulating layer 510 is located on one plane, and the plane where the upper surface of the first insulating layer 510 is located and the plane where the lower surface thereof is located are substantially parallel, so that the first insulating layer 510 may have an entirely uniform (e.g., substantially uniform) thickness. The lower surface of the first insulating layer 510 is placed on one surface of the via layer 177.

In some embodiments, the width of the upper surface of the first insulating layer 510 may be different from the width of the lower surface of the first insulating layer 510. For example, the plane where the side surface of the first insulating layer 510 is located may be inclined at an acute angle with respect to one surface of the via layer 177, and in this case, the width of the upper surface of the first insulating layer 510 may be smaller than the width of the lower surface of the first insulating layer 510. However, the present disclosure is not limited thereto, and the width of the upper surface of the first insulating layer 510 may be equal (e.g., substantially equal) to the width of the lower surface of the first insulating layer 510. In some embodiments, the plane where the side surface of the first insulating layer 510 is located may be perpendicular to one surface of the via layer 177.

The side surfaces of the first insulating layer 510 may face one side surface of the first inner bank 410 and one side surface of the second inner bank 420. One side surface of the first insulating layer 510 may be spaced from the side surface of the first electrode 210 disposed on the via layer 177 exposed by the first inner bank 410 and the second inner bank 420, and may face the side surface of the first electrode 210. The other side surface of the first insulating layer 510 may be spaced from the side surface of the second electrode 220 disposed on the via layer 177 exposed by the first inner bank 410 and the second inner bank 420, and may face the side surface of the second electrode 220. Although it is shown in FIG. 4 that the first insulating layer 510 is spaced from the first electrode 210 and the second electrode 220, the present disclosure is not limited thereto, and the first insulating layer 510 may be disposed to overlap at least a portion of the first electrode 210 and/or the second electrode 220. Details thereof will be described with reference to other drawings.

The first insulating layer 510 may include an inorganic insulating material. For example, the first insulating layer 510 may include an inorganic insulating material such as silicon oxide (SiOx), silicon nitride (SiNx), silicon oxynitride (SiOxNy), aluminum oxide (Al2O3), or aluminum nitride (AlN).

The first insulating layer 510 may be disposed between the first electrode 210 and the second electrode 220 to insulate the first electrode 210 and the second electrode 220 from each other. In some embodiments, the first insulating layer 510 may serve to provide a place where the light emitting element 300, which will be described later, may be in contact with other members.

A second insulating layer 520 is disposed on the first electrode 210. In detail, the second insulating layer 520 may be disposed to overlap at least a portion of the first electrode branch 210B of the first electrode 210. The second insulating layer 520 may be disposed on the first electrode 210 to overlap the upper surface of the first inner bank 410 in the third direction DR3. For example, the second insulating layer 520 may be disposed in at least a portion of the region where the first electrode branch 210б overlaps the upper surface of the first inner bank 410.

The second insulating layer 520 may be spaced from the first insulating layer 510. The second insulating layer 520 may expose at least a portion of the first electrode 210 disposed on the side surface of the first inner bank 410 to be spaced from the first insulating layer 510. Accordingly, the second insulating layer 520 may not overlap at least a portion of the first side surface of the first inner bank 410 in the third direction DR3.

A plurality of first openings 520H penetrating the second insulating layer 520 may be formed in the second insulating layer 520. The first opening 520H formed in the second insulating layer 520 exposes the first electrode 210 in the third direction DR3. Details of the first opening 520H will be described later.

The second insulating layer 520 may include an inorganic insulating material. For example, the first insulating layer 510 may include an inorganic insulating material such as silicon oxide (SiOx), silicon nitride (SiNx), silicon oxynitride (SiOxNy), aluminum oxide (Al₂O₃), or aluminum nitride (AlN). However, the present disclosure is not limited thereto, and the second insulating layer 520 may be formed to include the same material as the first insulating layer 510 in the same process. The first insulating layer 510 is formed between the first electrode 210 and the second electrode 220 to have a planar structure extending in the second direction DR2, whereas the second insulating layer 520 may be formed on the first electrode 210 to include the plurality of openings 520H and have a planar structure extending in the second direction DR2.

A first contact electrode layer 261 may be disposed on the first electrode 210 exposed by the second insulating layer 520. The first contact electrode layer 261 may be disposed on the first electrode 210 so as not to overlap the second insulating layer 520. A portion of the first contact electrode layer 261 may be disposed to fill the plurality of first openings 520H of the second insulating layer 520, and the other portion thereof may be disposed in a space between the first insulating layer 510 and the second insulating layer 520. Details of the first contact electrode layer 261 will be described later.

The light emitting element 300 may be disposed on the first insulating layer 510 between the electrodes 210 and 220. In some example embodiments, at least one light emitting element 300 may be disposed on the first insulating layer 510 disposed between the electrode branches 210B and 220B. However, the present disclosure is not limited thereto, and as will be described later, at least some of the light emitting elements 300 disposed in each sub-pixel PXn may be disposed on a region other than the region between the electrode branches 210B and 220B, for example, on the first electrode branch. Both ends of the light emitting element 300 may be disposed at the ends where the first electrode branch 210B and the second electrode branch 220B face each other, and may be electrically connected to the electrodes 210 and 220 through the first contact electrode layer 261 and a second contact electrode layer 262 to be described later.

Referring to FIGS. 5 and 6, the light emitting element 300 may be configured such that a plurality of layers are disposed in a direction horizontal to the via layer 177. The light emitting element 300 of the display device 10 according to some embodiments may have a shape extending in one direction and have a structure in which a plurality of semiconductor layers are sequentially disposed in one direction. The light emitting element 300 may have a cylindrical shape having a predetermined (e.g., set) length h and a predetermined (e.g., set) diameter.

The light emitting element 300 may be a light emitting diode (LED). For example, the light emitting element 300 may be an inorganic light emitting diode having a size of a micrometer or a nanometer and made of an inorganic material. When an electric field is formed between two electrodes (e.g., 210 and 220) facing each other in a predetermined (e.g., set) direction, the organic light emitting diode may be aligned between the two electrodes having polarity. The light emitting element 300 may be aligned between the two electrodes (e.g., first electrode branch 210B and second electrode branch 220B) by an electric field formed on the two electrodes (e.g., 210 and 220).

The light emitting element 300 may have a shape extending in one direction. The light emitting element 300 may have a shape of a nanorod, a nanowire, a nanotube, or the like. In some example embodiments, the light emitting element 300 may have a cylindrical shape or a rod shape. However, the shape of the light emitting element 300 is not limited thereto, and the light emitting element 300 may have various shapes such as a cube, a cuboid, and a hexagonal column, or may have a shape which extends in one direction and the outer surface of which is partially inclined. A plurality of semiconductors included in the light emitting element 300 to be described later may be sequentially arranged or stacked in one direction.

The light emitting element 300 according to some embodiments may include a first semiconductor 310, a second semiconductor 320, an active layer 330, and an insulating film 380. The light emitting element 300 may further include an electrode layer 370. In some embodiments, in FIG. 6, the light emitting element 300 may include a larger number of conductive electrode layers 370 or the electrode layer 370 may be omitted. Description of the light emitting element 300 described later may be equally applied even if the number of the electrode layers 370 is different or the light emitting element 300 further includes other structures.

In the light emitting element 300, the first semiconductor 310, the active layer 330, the second semiconductor 320, and the electrode layer 370 may be sequentially disposed in this order along one direction. One extending direction of the light emitting element 300 provided in the display device 10 may be disposed to be parallel to the via layer 177, and the plurality of semiconductors included in the light emitting element 300 may be sequentially arranged along a direction parallel to the upper surface of the via layer 177. However, the present disclosure is not limited thereto, and the light emitting element 300 may have a different structure, and in some embodiments, the semiconductors of the light emitting element 300 may be arranged along a direction different from that of the illustrated embodiment.

The first semiconductor 310 may be an n-type semiconductor. For example, when the light emitting element 300 emits light of a blue wavelength band, the first semiconductor 310 may include a semiconductor material having a chemical formula of $Al_xGa_yIn_{1-x-y}N$ ($0\le x\le 1$, $0\le y\le 1$, $0\le x+y\le 1$). The semiconductor material included in the first semiconductor 310 may be at least one of AlGaInN, GaN, AlGaN, InGaN, AlN, and InN, each being doped with n-type impurities. The first semiconductor 310 may be doped with an n-type dopant. The n-type dopant may be Si, Ge, or Sn. In some example embodiments, the first semiconductor 310 may be n-GaN doped with n-type Si.

The second semiconductor 320 is disposed on the active layer 330 described later. The second semiconductor 320 may be a p-type semiconductor. For example, when the light emitting element 300 emits light of a blue wavelength band or a green wavelength band, the second semiconductor 320 may include a semiconductor material having a chemical formula of $Al_xGa_yIn_{1-x-y}N$ ($0\le x\le 1$, $0\le y\le 1$, $0\le x+y\le 1$). The semiconductor material included in the second semiconductor 320 may be at least one of AlGaInN, GaN, AlGaN, InGaN, AlN, and InN, each being doped with p-type impurities. The second semiconductor 320 may be doped with a p-type dopant. The second dopant may be Mg, Zn, Ca, Se, or Ba. In some example embodiments, the second semiconductor 320 may be p-GaN doped with p-type Mg.

Meanwhile, although it is shown in FIG. 6 that each of the first semiconductor 310 and the second semiconductor 320 is formed as one layer, the present disclosure is not limited thereto. In some embodiments, each of the first semiconductor 310 and the second semiconductor 320 may further include a larger number of layers, for example, clad layers or tensile strain barrier reducing (TSBR) layers.

The active layer 330 is disposed between the first semiconductor 310 and the second semiconductor 320. The active layer 330 may include a material of a single or multiple quantum well structure. When the active layer 330 includes a material of a multiple quantum well structure, the active layer 330 may have a structure in which quantum layers and well layers are alternately laminated. However, the present disclosure is not limited thereto, and the active layer 330 may have a structure in which semiconductor materials having high bandgap energy and semiconductor materials having low bandgap energy are alternately laminated, and may include other group 3 to group 5 semiconductor materials depending on the wavelength bad of light.

The active layer 330 may emit light by the combination of electron-hole pairs according to an electrical signal applied through the first conductive semiconductor 310 and the second conductive semiconductor 320. For example, when the active layer 330 emits light of a blue wavelength band, the active layer 330 may include a material such as AlGaN or AlGaInN. In particular, when the active layer 330 has a multiple quantum well structure in which quantum layers and well layers are alternately laminated, the quantum wells may include a material such as AlGaN or AlGaInN, and the well layers may include a material such as GaN or AlInN. In some example embodiments, the active layer 330 includes quantum wells each containing AlGaInN and well layers each containing AlInN, and thus the active layer 330 may emit blue light having a central wavelength band of 450 nm to 495 nm as described above. The light emitted from the active layer 330 is not limited to light of a blue wavelength band, and in some cases, the active layer 330 may emit light of a red or green wavelength band.

The active layer 330 of the light emitting element 300 may emit light of a specific wavelength band without directivity. The light emitted from the active layer 330 may be emitted through the outer surface of the light emitting element 300 in the length direction. In some embodiments, the light emitted from the active layer 330 may also be emitted to both side surfaces. For example, the light emitted from the active layer 330 of the light emitting element 300 may be emitted in the lateral direction of the light emitting element 300, including the direction of both ends of the light emitting element 300. Therefore, the direction of the light emitted from the active layer 330 is not limited to one direction.

The electrode layer 370 may be an ohmic contact electrode. However, the present disclosure is not limited thereto, and the electrode layer 370 may be a Schottky contact electrode. For example, the electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). The conductive electrode layer 370 may include a semiconductor material doped with n-type or p-type impurities. The conductive electrode layer 370 may include the same material, and may include different materials from each other, but the present disclosure is not limited thereto.

The insulating film 380 is disposed to surround the outer surfaces of the plurality of semiconductors described above. In some example embodiments, the insulating film 380 may be disposed to surround at least the outer surface of the active layer 330, and may extend in one direction in which the light emitting element 300 extends. The insulating film 380 may function to protect the first semiconductor 310, the second semiconductor 320, and the active layer 330. For example, the insulating film 380 may be formed to surround the side surfaces of the members, and may be formed such that the electrode layer 370 disposed at both end of the light emitting element 300 in the length direction, at least a portion of the first semiconductor 310, and at least a portion of the second semiconductor 320 are exposed.

The insulating film 380 may be formed to cover the outer surface of the active layer 330, but may be formed to at least partially expose the outer surfaces of the first semiconductor 310 and the second semiconductor 320. For example, the insulating film 380 may be disposed on the side surface of the first semiconductor 310 to expose at least a portion of the first semiconductor 310, may extend in the length direction of the light emitting element 300 to be disposed on the second semiconductor 320, and may be formed to cover the side surface of the second semiconductor 320 so as to expose at least a portion of the second semiconductor 320. However, the present disclosure is not limited thereto, and the insulating film 380 may cover the entire outer surface of the active layer 330, but may expose the outer surface of another member.

The thickness of the insulating film 380 may have a range of 10 nm to 1.0 μm, but is not limited thereto. In some embodiments, the thickness of the insulating film 380 may be 40 nm.

The insulating film 380 may include a material having insulating properties, for example, silicon oxide (SiOx), silicon nitride (SiNx), silicon oxynitride (SiOxNy), aluminum nitride (AlN), or aluminum oxide ($Al_2O_3$). Thus, the active layer 330 may be protected from an electrical short that may occur when the active layer 330 is in direct contact with an electrode through which an electrical signal is transmitted to the light emitting element 300. Further, because the insulating film 380 protects the outer surface of the light emitting element 300 as well as the active layer 330, it is possible to prevent or reduce the deterioration in light emission efficiency.

In some embodiments, the outer surface of the insulating film 380 may be surface-treated. When manufacturing the display device 10, the light emitting elements 300 may be aligned by being sprayed onto the electrodes (e.g., 210 and 220) in a state in which they are dispersed in a predetermined (e.g., set) ink. Here, the surface of the insulating film 380 may be hydrophobically or hydrophilically treated in order to maintain the light emitting elements 300 in a dispersed state without being aggregated with other adjacent light emitting elements 300 in the ink.

The diameter of the light emitting element 300 may have a range of 0.5 μm to 1.5 μm, and the length h of the light emitting element 300 may have a range of 1 μm to 10 μm. In some example embodiments, the length h of the light emitting element 300 may have a range of 2.5 μm to 4.5 μm.

According to some embodiments, the first semiconductor 310, the active layer 330, and the second semiconductor 320 of the light emitting element 300 may be sequentially disposed along one direction in which the light emitting element 300 extends, and the first semiconductor 310, the active layer 330, and the second semiconductor 320 of the light emitting element 300 may be sequentially disposed on the first insulating layer 510 along a direction parallel to the via layer 177.

A third insulating layer 530 is disposed on the light emitting element 300, the first contact electrode layer 261, and the second insulating layer 520. The third insulating layer 530 may be disposed to expose at least a portion of the light emitting element 300 disposed on the first insulating layer 510. The third insulating layer 530 may be disposed to partially surround the outer surface of the light emitting element 300. The third insulating layer 530 may serve to protect the light emitting element 300 and to fix the light emitting element 300 in the manufacturing process of the display device 10. The third insulating layer 530 may be interposed between the first contact electrode layer 261 and a second contact electrode layer 262, which will be described later, to insulate the first contact electrode layer 261 and the second contact electrode layer 262 from each other. Details of the third insulating layer 530 will be described later.

The second contact electrode layer 262 is entirely disposed on the first electrode 210 and the second electrode 220. The second contact electrode layer 262 may completely cover the second electrode 220, and may extend toward the first electrode 210 to completely cover the third insulating layer 530 disposed on the first electrode 210. The third insulating layer 530 may be interposed between the first contact electrode layer 261 and the second contact electrode layer 262 disposed on the first electrode 210. As described above, the first contact electrode layer 261 and the second contact electrode layer 262 may be insulated from each other by the third insulating layer 530.

A passivation layer 550 may be disposed on the via layer 177, the plurality of electrodes 210 and 220, and the second contact electrode layer 262. The passivation layer 550 may be disposed on the entire surface of members disposed on the via layer 177 and may function to protect against external environments of the members disposed on the via layer 177.

The passivation layer 550 may include an inorganic insulating material or an organic insulating material. In some example embodiments, the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). The passivation layer 550 may include an organic insulating material such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the material thereof is not limited thereto.

Referring to FIG. 5, the first insulating layer 510 and the first contact electrode layer 261 may be disposed to be adjacent to each other. The first contact electrode layer 261 may extend to a side where the first insulating layer 510 is disposed on or adjacent to the first electrode 210 to contact the side surface of the first insulating layer 510. The upper surface of the first insulating layer 510 and the upper surface of the first contact electrode layer 261 disposed adjacent to the first insulating layer 510 may be formed in parallel to form the same plane. For example, the upper surface of the first insulating layer 510 and the upper surface of the first contact electrode layer 261 disposed adjacent to the first insulating layer 510 may form a flat surface without a step.

The length h of the light emitting element 300 disposed on the first insulating layer 510 may be greater than the width of the upper surface of the first insulating layer 510. As the length h of the light emitting element 300 is greater than the width of the upper surface of the first insulating layer 510, at least some regions of both ends of the light emitting element 300 may be disposed to protrude from the upper surface of the first insulating layer 510.

The light emitting element 300 disposed on the first insulating layer 510 may be in contact with the first contact electrode layer 261 and the second contact electrode layer 262 at both ends exposed by the insulating film 380 of the light emitting element 300 protruding from the first insulating layer 510. One end region of the light emitting element 300 disposed on the first insulating layer 510 may be in contact with the first contact electrode layer 261 contacting the first electrode 210, and the other end thereof may be in contact with the second contact electrode layer 262 contacting the second electrode 220.

The light emitting element 300 may be disposed on the first insulating layer 510 and may protrude from the first insulating layer 510, so that one end region of the light emitting element 300 may be disposed on the first contact electrode layer 261 adjacent to the first insulating layer 510. In detail, the light emitting element 300 may be generally in contact with the upper surface of the first insulating layer 510, and one end region of the light emitting element 300 may be in contact with the upper surface of the first contact electrode layer 261 disposed adjacent to the first insulating layer 510. Although it is shown in the drawings that the electrode layer 370 disposed at one end region of the light emitting element 300, and a portion of the second semiconductor 320 are in contact with the upper surface of the first contact electrode layer 261, the present disclosure is not limited thereto. For example, the upper surface of the first contact electrode layer 261 may be in contact with the electrode layer 370 disposed at one end region of the light emitting element 300, but may not be in contact with the second semiconductor 320.

The light emitting element 300 may be disposed on the first insulating layer 510, and the other end of the light emitting element 300 may protrude from the first insulating layer 510. The third insulating layer 530 may be disposed on the light emitting element 300 to expose at least a portion of the other end of the light emitting element 300. The third insulating layer 530 and the other end of the light emitting element 300 exposed by the first insulating layer 510 may be in contact with the second contact electrode layer 262. However, the present disclosure is not limited thereto, and the second contact electrode layer 262 may be in contact with the lower surface, side surface and upper surface of the other end of the light emitting element 300 disposed on the first insulating layer 510. In some example embodiments, a portion of the first semiconductor 310 of the light emitting element 300 is disposed to contact the second contact electrode layer 262, but the present disclosure is not limited thereto.

The first contact electrode layer 261 and the second contact electrode layer 262 may include a conductive material. For example, the first contact electrode layer 261 and the second contact electrode layer 262 may include ITO, IZO, ITZO, or aluminum (Al). However, the material thereof is not limited thereto.

Figure 7:
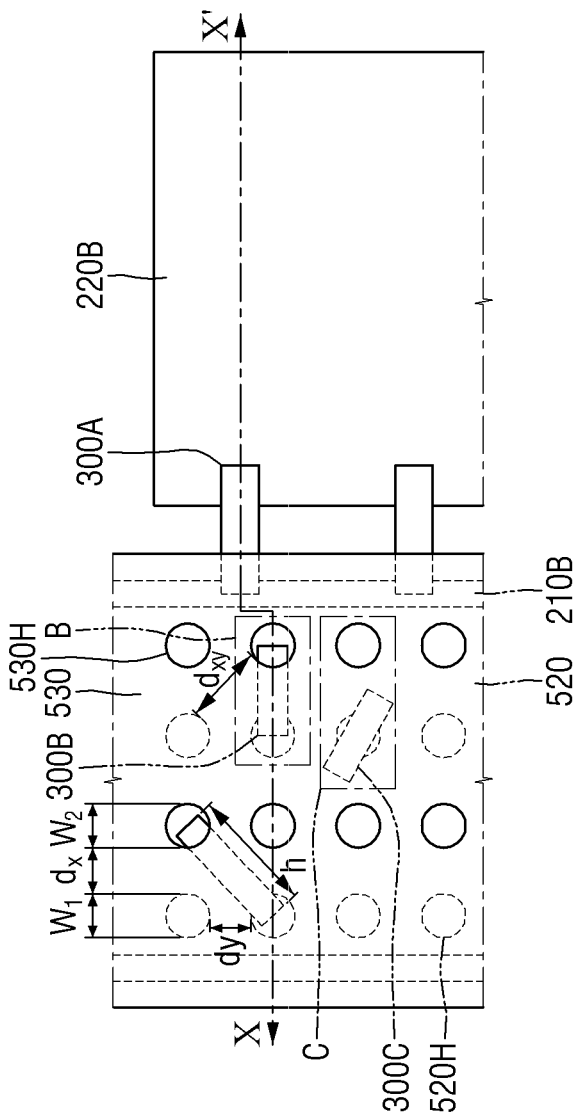
FIG. 7 is a plan view illustrating a relative arrangement of a plurality of light emitting elements, a plurality of electrodes, a second insulating layer, and a third insulating layer, according to some embodiments of the present disclosure.
Figure 8:
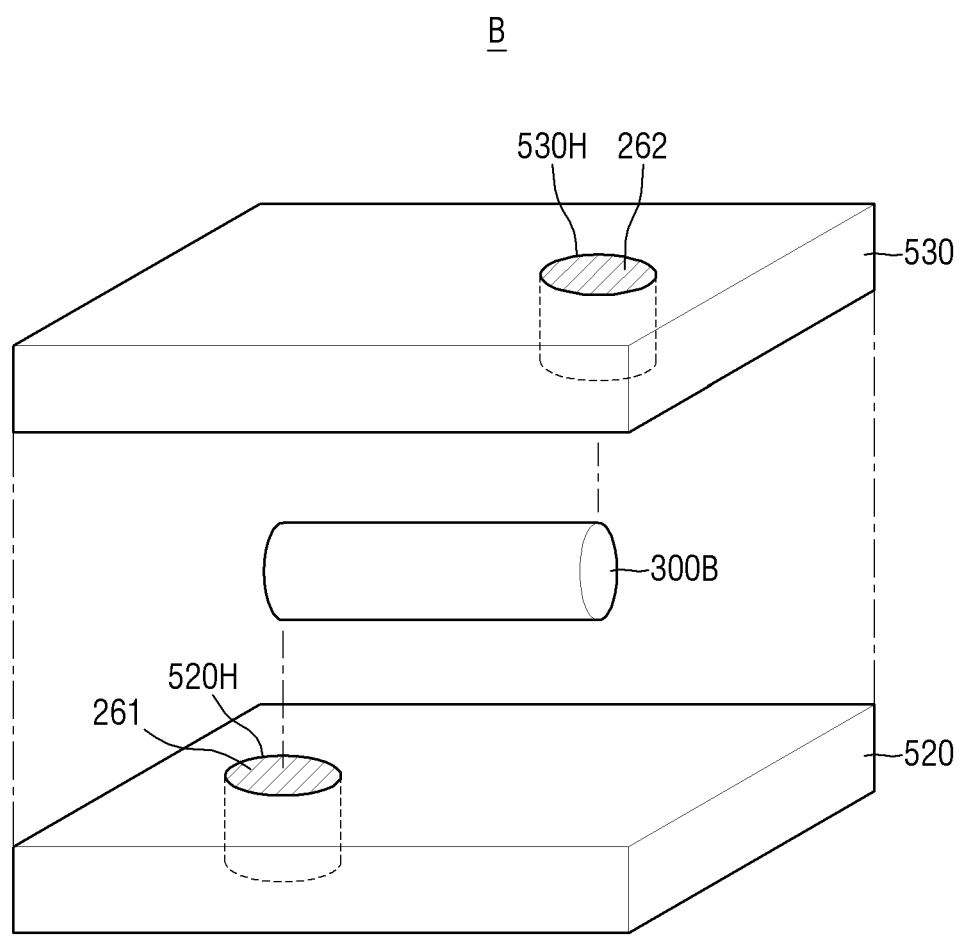
FIG. 8 is an enlarged perspective view of the portion B in FIG. 7, according to some embodiments of the present disclosure.
Figure 9:
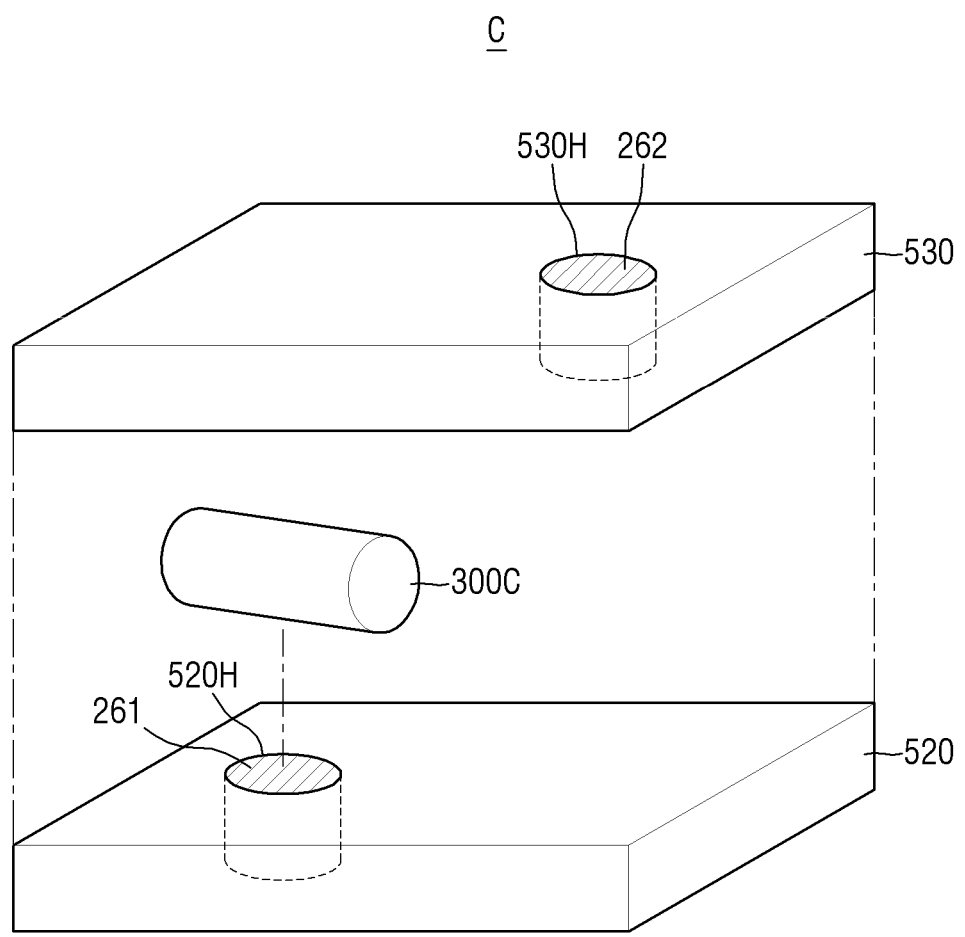
FIG. 9 is an enlarged perspective view of the portion C in FIG. 7, according to some embodiments of the present disclosure.

FIG. 7 is a plan view illustrating a relative arrangement of a plurality of light emitting elements, a plurality of electrodes, a second insulating layer, and a third insulating layer, according to some embodiments of the present disclosure, FIG. 8 is an enlarged perspective view of the portion B in FIG. 7, according to some embodiments of the present disclosure, and FIG. 9 is an enlarged perspective view of the portion C in FIG. 7, according to some embodiments of the present disclosure.

Referring to FIGS. 7-9, the plurality of light emitting elements 300 arranged in one sub-light emitting area may include a first light emitting element 300A, a second light emitting element 300B, and a third light emitting element 300C. Each of the first light emitting element 300A, the second light emitting element 300B, and the third light emitting element 300C may be substantially the same as the aforementioned light emitting element 300. Therefore, a description of the structure and shape of each of the light emitting elements 300A, 300B, and 300C will be replaced with the description of the aforementioned light emitting element 300.

Hereinafter, the plurality of openings 520H and 530H formed in the second insulating layer 520 and the third insulating layer 530, and the first light emitting element 300A, the second light emitting element 300B, and the third light emitting element 300C according to the relative arrangement of the plurality of light emitting elements 300 will be described in detail. Prior to this, the structures of the second insulating layer 520 and the third insulating layer 530 will be described.

Referring to FIGS. 4 and 7, the second insulating layer 520 may be disposed on the first electrode 210, for example, the first electrode branch 210B. The plurality of first openings 520H may be formed in the second insulating layer 520. The plurality of first openings 520H may be formed to completely penetrate the second insulating layer 520 in the third direction (or thickness direction DR3). At least some of the plurality of first openings 520H formed in the second insulating layer 520 may expose the first electrode 210, for example, the first electrode branch 210B, disposed under the second insulating layer 520, The planar shape of each of the plurality of first openings 520H may be circular (e.g., substantially circular). The plurality of first openings 520H formed in the second insulating layer 520 may have the same planar area. For example, each of the first openings 520H formed in the second insulating layer 520 may have a circular shape having a predetermined (e.g., set) diameter W1. However, the present disclosure is not limited thereto, and the planar shapes of the plurality of first openings 520H may be applied as other shapes such as a rectangle, an ellipse, and a square, or the sizes of the planar shapes of the first openings 520H may be different from each other.

The respective first openings 520H may be spaced from each other at predetermined (e.g., set) intervals. The plurality of first openings 520H may be spaced from each other at predetermined (e.g., set) intervals in the first direction DR1 and the second direction DR2. In some example embodiments, the interval between the first openings 520H adjacent in the first direction DR1 may be different from the interval between the first openings 520H adjacent in the second direction DR2. For example, the interval between the first openings 520H adjacent in the first direction DR1 may be greater than the interval between two first openings 520H adjacent in the second direction DR2. However, the present disclosure is not limited thereto, according to the shape of each of the first openings 520H, the interval between two first openings 520H adjacent in the first direction DR1 may be different from the interval between two first openings 520H adjacent in the second direction DR2. Details of the interval between two adjacent first openings 520H will be described later with reference to the description of the third insulating layer 530.

Although it is shown in the drawings that two first openings 520H formed in the second insulating layer 520 are arranged along the first direction DR1, the arrangement and number of the plurality of first openings 520H formed in the second insulating layer 520 may vary without being limited thereto.

The third insulating layer 530 may be disposed on the second insulating layer 520. The third insulating layer 530 may entirely cover the second insulating layer 520 and the first electrode branch 210B (or the first electrode 210). The third insulating layer 530 may entirely cover the first electrode branch 210б, and may extend outward to cover at least a portion of the light emitting element 300 disposed between the first electrode 210 and the second electrode 220.

The plurality of second openings 530H may be formed in the third insulating layer 530 disposed on the first electrode branch 210B. The plurality of second openings 530H may be formed to completely penetrate the third insulating layer 530 in the third direction (or thickness direction DR3). At least some of the plurality of second openings 530H formed in the third insulating layer 530 may expose the second insulating layer 520 disposed under the third insulating layer 530, The planar shape of each of the plurality of second openings 530H may be circular. The plurality of second openings 530H formed in the third insulating layer 530 may have the same planar area. For example, each of the second openings 530H formed in the third insulating layer 530 may have a circular shape having a predetermined (e.g., set) diameter W2. However, the present disclosure is not limited thereto, and the planar shapes of the plurality of second openings 530H may be applied as other shapes such as a rectangle, an ellipse, and a square, or the sizes of the planar shapes of the second openings 530H may be different from each other.

The respective second openings 530H may be spaced from each other at predetermined (e.g., set) intervals. The plurality of second openings 530H may be spaced from each other at predetermined (e.g., set) intervals in the first direction DR1 and the second direction DR2. In some example embodiments, the interval between the second openings 530H adjacent in the first direction DR1 may be different from the interval between the second openings 530H adjacent in the second direction DR2. For example, the interval between the second openings 530H adjacent in the first direction DR1 may be greater than the interval between two second openings 530H adjacent in the second direction DR2. However, the present disclosure is not limited thereto, according to the shape of each of the second openings 530H, the interval between two second openings 530H adjacent in the first direction DR1 may be different from the interval between two second openings 530H adjacent in the second direction DR2.

Although it is shown in the drawings that two second openings 530H formed in the third insulating layer 530 are arranged along the first direction DR1, the arrangement and number of the plurality of second openings 530H formed in the third insulating layer 530 may vary without being limited thereto.

Hereinafter, a planar relative arrangement relationship between the plurality of first openings 520H formed in the second insulating layer 520 and the plurality of second openings 530H formed in the third insulating layer 530 will be described.

The first openings 520H and the second openings 530H may be arranged in a matrix shape. The first and second openings 520H and 530H may be spaced from each other at predetermined (e.g., set) intervals along the first direction DR1 and the second direction DR2 on a plane, respectively. For example, the first opening 520H and the second opening 530H may be arranged not to overlap each other in the third direction DR3 (or thickness direction).

Although it is shown in the drawings that the arrangement direction of the first and second openings 520H and 530H coincides with the extending direction of the first electrode branch 210B toward the first direction DR1 and the second direction DR2, the present disclosure is not limited thereto, and the arrangement direction of the first and second openings 520H and 530H and the extending direction of the first electrode branch 210B may be inclined with a predetermined (e.g., set) angle.

In some example embodiments, the first openings 520H may be arranged in odd columns of a matrix, and the second openings 530H may be arranged in even columns of the matrix. The first and second openings 520H and 530H may be alternately arranged at the same row of the matrix. For example, the first openings 520H are arranged in the first column and the third column such that the first column and the third column extend in a straight line shape, and the second openings 530H may be arranged in the second column and the fourth column such that the second column and the fourth column extend in a straight line shape. The first and second openings 520H and 530H arranged at the same row may extend such that the respective columns has a straight line shape, and the first and second openings 520H and 530H may be arranged alternately with each other. However, the present disclosure is not limited thereto, and the first openings 520H and the second openings 530H may be variously arranged.

As shown in FIG. 7, the distance dx between the first opening 520H and the second opening 530H adjacent to each other in the first direction DR1 may be equal (e.g., substantially equal) to the distance dy between the two first openings 520H adjacent to each other in the second direction DR2. Further, the distance dy between the two first openings 520H adjacent to each other in the second direction DR2 may be equal (e.g., substantially equal) to the distance dy between the two second openings 530H adjacent to each other in the second direction DR2. However, the present disclosure is not limited thereto, and the distance dx between the first opening 520H and the second opening 530H adjacent to each other in the first direction DR1 may be different from the distance dy between two first openings 520H adjacent to each other in the second direction DR2. Although it is shown in FIG. 7 that each row and each column, in which the first and second openings 520H and 530H are arranged, extend in a straight line shape, the first and second openings 520H and 530H may be arranged to be staggered for each neighboring row or each neighboring column of the matrix.

Hereinafter, the plurality of light emitting elements 300 will be described in more detail according to areas where the plurality of light emitting elements 300 are arranged and/or the relative arrangement of the plurality of first and second openings 520H and 530H and the plurality of light emitting elements 300.

As described above, the plurality of light emitting elements 300 may include a first light emitting element 300A, a second light emitting element 300B, and a third light emitting element 300C. Among the plurality of light emitting elements 300, the first light emitting element 300A may be disposed between the first electrode branch 210B and the second electrode branch 220B, and the second light emitting element 300B and the third light emitting element 300C may be disposed on an area where the first electrode branch 210B overlapping the upper surface of the first inner bank 410 is disposed.

For example, among the plurality of light emitting elements 300, the first light emitting element 300A is defined as a light emitting element disposed in a space between the first electrode branch 210B and the second electrode branch 220B. Among the plurality of light emitting elements 300 disposed on the first electrode branch 210B, the second light emitting element 300B is defined as a light emitting element disposed to overlap the first opening 520H and the second opening 530H in the third direction DR3. Among the plurality of light emitting elements 300 disposed on the first electrode branch 210B, the third light emitting element 300C is defined as a light emitting element disposed to overlap at least one of the first opening 520H and the second opening 530H in the third direction DR3.

The first light emitting element 300A may be substantially the same as the light emitting element 300 described above with reference to FIGS. 2-5. Therefore, the first light emitting element 300A may be disposed in a space between the first electrode branch 210B and the second electrode branch 220B. For example, the first light emitting element 300A may be disposed on the first insulating layer 510 disposed between the first electrode branch 210B and the second electrode branch 220B.

One extending direction of the first light emitting element 300A may be substantially parallel to a direction in which the first electrode branch 210B and the second electrode branch 220B are spaced from each other, for example, the first direction DR1. Therefore, one of both ends of the first light emitting element 300A may overlap the first electrode branch 210B, and the other of both ends of the first light emitting element 300A may overlap the second electrode branch 220B. However, the present disclosure is not limited thereto, and both ends of the first light emitting element 300A may not overlap the first electrode branch 210B and/or the second electrode branch 220B. In some embodiments, as described above, the first light emitting element 300A may be electrically connected to the first electrode branch 210B (or the first electrode 210) by the first contact electrode layer 261, and may be electrically connected to the second electrode branch 220B (or the second electrode 220) by the second contact electrode layer 262.

The second light emitting element 300B may be disposed on the second insulating layer 520. The second light emitting element 300B may be disposed to overlap the first electrode branch 2106 disposed on the upper surface of the first inner bank 410 in the third direction DR3. The second light emitting element 300B may be randomly disposed on the upper surface of the second insulating layer 520 without directivity. For example, unlike the first light emitting element 300A in which one extending direction thereof is substantially parallel to the first direction DR1, one extending direction of the second light emitting element 300B may be parallel to the first direction DR1 or may be inclined at a predetermined (e.g., set) angle.

Referring to FIGS. 7 and 8, the second light emitting element 300B may be disposed to overlap the first opening 520H formed in the second insulating layer 520 and the second opening 530H formed in the third insulating layer 530 in the third direction DR3. In detail, one end region of the second light emitting element 300B may overlap one of the first openings 520H in the third direction DR3, and the other end region thereof may overlap one of the second openings 530H in the third direction DR3.

The first opening 520H is filled with the first contact electrode layer 261, and the second opening 530H is filled with the second contact electrode layer 262, so that one end region of the second light emitting element 300B may be in contact with the first contact electrode layer 261, and the other end region thereof may be in contact with the second contact electrode layer 262. In the second light emitting element 300B, one end region of the second light emitting element 300B is in contact with the first contact electrode layer 261 filling the first opening 520H, and the other end region thereof is in contact with the second contact electrode layer 262 filling the second opening 530H, so that the second light emitting element 300B may be electrically connected to the first electrode 210 and the second electrode 220 through the first and second contact electrode layers 261 and 262.

The third light emitting element 300C may be disposed on the second insulating layer 520. The third light emitting element 300C may be disposed to overlap the first electrode branch 2106 disposed on the upper surface of the first inner bank 410 in the third direction DR3. The third light emitting element 300C may be randomly disposed on the upper surface of the second insulating layer 520 without directivity. For example, unlike the first light emitting element 300A in which one extending direction thereof is substantially parallel to the first direction DR1, one extending direction of the third light emitting element 300C may be parallel to the first direction DR1 or may be inclined at a predetermined (e.g., set) angle.

Referring to FIGS. 7 and 9, the third light emitting element 300C may be disposed not to overlap at least one of the first opening 520H formed in the second insulating layer 520 and the second opening 530H formed in the third insulating layer 530 in the third direction DR3. For example, the third light emitting element 300C may not overlap the first opening 520H in the third direction DR3, or may not overlap the second opening 530H in the third direction DR3. Further, the third light emitting element 300C may overlap the first opening 520H in the third direction DR3, but may not overlap the second opening 530H in the third direction DR3. Further, the third light emitting element 300C may not overlap the first opening 520H in the third direction DR3, but may overlap the second opening 530H in the third direction DR3. Therefore, among the plurality of light emitting elements 300, the third light emitting element 300C may be defined as a light emitting element in which at least one of one end region and the other end region thereof is disposed not to overlap at least one of the first opening 520H and the second opening 530H in the third direction DR3.

Because the third light emitting element 300C does not overlap the first opening 520H filled with the first contact electrode layer 261 or the second opening 530H filled with the second contact electrode layer 262 in the third direction DR3, the third light emitting element 300C may not be in contact with at least one of the first contact electrode layer 261 and the second contact electrode layer 262. Therefore, the third light emitting element 300C may not be electrically connected to at least one of the first electrode 210 and the second electrode 220.

Referring to FIG. 7 again, the distance dx between the first opening 520H and the second opening 530H disposed adjacent to each other along the first direction DR1 on the plane may be smaller than the length h of the light emitting element 300. Similarly, the distance dy between the first openings 520H disposed adjacent to each other along the second direction DR2 on the plane, and/or the distance dy between the second openings 530H disposed adjacent to each other along the second direction DR2 on the plane may be smaller than the length h of the light emitting element 300. Further, the distance dxy between the first opening 520H and the second opening 530H disposed adjacent to each other along a diagonal direction on the plane may be smaller than the length h of the light emitting element 300. Because the distance dx, dy, or dxy between the first and second openings 520H and 530H disposed adjacent to each other along the first direction DR1, the second direction DR2, or the diagonal direction of the first direction DR1 and the second direction DR2 is formed to be smaller than the length h of the light emitting element 300, one end region and the other end region of the second light emitting element 300B may overlap the first opening 520H and the second opening 530H in the third direction DR3, respectively. In such a case, efficiency in which the first contact electrode layer 261 and the second contact electrode layer 262 filling the first and second openings 520H and 530H, respectively, are in contact with both ends of the second light emitting element 300B may increase.

The diameter W2 of the second opening 530H may be smaller than the length h of the light emitting element 300 or 300B. In some example embodiments, the length h of the light emitting element 300 may have a range of 2.5 µm to 4.5 µm, and the diameter W2 of the second opening 530H may be formed to be smaller than the length h of the light emitting element 300. For example, when the length h of the light emitting element 300 is 3.5 µm, the diameter W2 of the second opening 530H may be smaller than 3.5 µm. However, in some embodiments, in order to increase an area where the second contact electrode layer 262, which will be described later, overlaps the other end region of the second light emitting element 300B, the diameter W2 of the second opening 530H may be formed to be as large as possible within a range smaller than 3.5 µm. Accordingly, the second light emitting element 300B randomly disposed on the second insulating layer 520 without directivity may not be completely exposed in the third direction DR3 by the second opening 530H of the third insulating layer 530.

Accordingly, even when the second opening 530H and the second light emitting element 300B partially overlap each other in the thickness direction DR3, the third insulating layer 530 is disposed on at least a portion of the second light emitting element 300B, and thus the second light emitting element 300B may be fixed on the first electrode branch 210B by the third insulating layer 530 disposed on at least a portion of the second light emitting element 300B. Further, the diameter W2 of the second opening 530H may be formed to be smaller than the length h of the second light emitting element 300B, thereby preventing or protecting the second light emitting element 300B from moving from the first electrode branch 210B of the second light emitting element 300B to another member. Accordingly, the third insulating layer 530 provided with the plurality of second openings 530H may serve to fix the second light emitting element 300B on the first electrode branch 210B, and may also serve to prevent or protect the second light emitting element 300B from moving to another member other than the first electrode branch 210B.

Because the third insulating layer 530 is disposed on the first to third light emitting elements 300A, 300B, and 300C positions thereof may be fixed. In the case of the first light emitting element 300A, both ends thereof are electrically connected to the electrodes 210 and 220 by the contact electrode layers 261 and 262, respectively, and in the case of the second light emitting element 300B, both ends thereof are electrically connected to the electrodes 210 and 220 by the contact electrode layers 261 and 262 filling the first and second openings 520H and 530H, respectively. The third light emitting element 300C remains in a state where the third light emitting element 300C is not electrically connected to at least one of the electrodes 210 and 220, and in some embodiments, the residual third light emitting element 300C may be lost during a subsequent process and remain as foreign matter in the display device 10. Because the display device 10 according to some embodiments may include the third insulating layer 530 disposed on the first to third light emitting elements 300A, 300B, and 300C and further include the openings 520H and 530H overlapping both ends of the second light emitting element 300B in the third direction and the contact electrode layers 261 and 262 filling the openings 520H and 530H, the loss of these components during the manufacturing process of the display device 10 may be prevented or reduced, the second light emitting element 300B disposed on the first electrode 210 may be electrically connected to each of the electrodes 210 and 220 to emit light, thereby improving the luminance of the display device 10.

Figure 10:
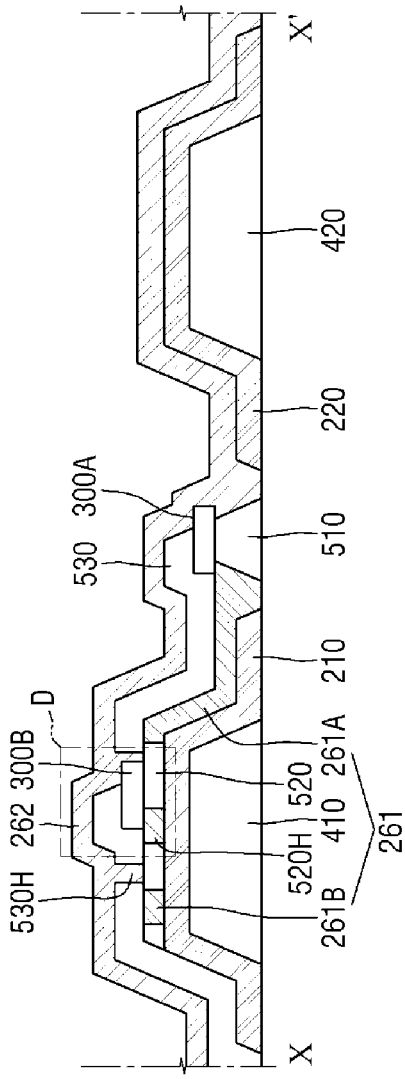
FIG. 10 is a cross-sectional view taken along the line X-X' in FIG. 7, according to some embodiments of the present disclosure.
Figure 11:
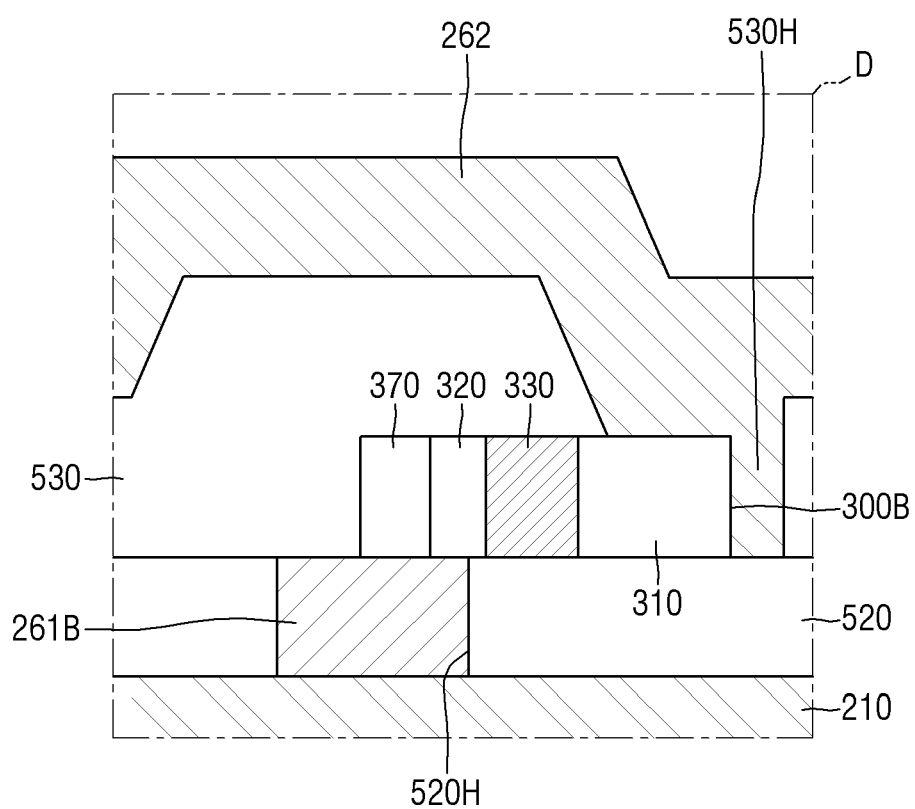
FIG. 11 is an enlarged cross-sectional view illustrating an example of a second light emitting element, a plurality of insulating layers, and a plurality of contact electrodes in the portion D of FIG. 10, according to some embodiments of the present disclosure.

FIG. 10 is a cross-sectional view taken along the line X-X' in FIG. 7, according to some embodiments of the present disclosure and FIG. 11 is an enlarged cross-sectional view illustrating an example of a second light emitting element, a plurality of insulating layers, and a plurality of contact electrodes in the portion D of FIG. 10, according to some embodiments of the present disclosure.

Referring to FIGS. 10 and 11, as described above, the first insulating layer 510 may be disposed between the first electrode 210 and the second electrode 220. The first light emitting element 300A is disposed on the upper surface of the first insulating layer 510. Because the length of the first light emitting element 300A is greater than the width of the upper surface of the first insulating layer 510, at least one of both end regions of the first light emitting element 300A may protrude from the first insulating layer 510.

The plurality of first openings 520H may be formed in the second insulating layer 520 disposed on the first electrode 210 overlapping the upper surface of the first inner bank 410. The second insulating layer 520 may be disposed on the first electrode 210 overlapping the upper surface of the first inner bank 410, and may be spaced from the first insulating layer 510. Accordingly, the first electrode 210 disposed on the side surface of the first inner bank 410 at a side facing the second inner bank 420 may be exposed in the third direction DR3 by the first insulating layer 510 and the second insulating layer 520.

The first contact electrode layer 261 is disposed on the first electrode 210 exposed by the first insulating layer 510 and the second insulating layer 520. The first contact electrode layer 261 may include a first contact electrode 261A disposed in a first region, and a second contact electrode 261B disposed in a second region. The lower surface of the first contact electrode layer 261 may be in contact with the first electrode 210.

The first region of the first electrode 210 may be a space between the first insulating layer 510 and the second insulating layer 520, for example, a region overlapping the side surface of the first inner bank 410, disposed on a side facing the second inner bank 420 among both side surfaces of the first inner bank 410. The first contact electrode 261A may be disposed on the first electrode 210 disposed on the side surface of the first inner bank 410. The first contact electrode 261A may extend outwardly on the first electrode 210 to be provided up to the side surface of the first insulating layer 510. One end of the first contact electrode 261A may be in contact with the first electrode 210, and the other end thereof may be in contact with the side surface of the first insulating layer 510.

The upper surface of the first contact electrode 261A disposed in a region adjacent to the first insulating layer 510 may be formed to be parallel to the upper surface of the first insulating layer 510. Accordingly, the first insulating layer 510 and the first contact electrode 261A may be formed without a step to have flat upper surfaces. Therefore, the first light emitting element 300A may be disposed on the upper surface of the first insulating layer 510 and the upper surface of the first contact electrode 261A. At least a portion of one end region of the first light emitting element 300A may be disposed to overlap the first contact electrode 261A in the third direction DR3. The upper surface of the first contact electrode 261A may be in contact with the lower surface of one end region of the first light emitting element 300A. Therefore, the first light emitting element 300A may be electrically connected to the first electrode 210 through the first contact electrode 261A.

The second region of the first electrode 210 may be a region in which the plurality of first openings 520H formed in the second insulating layer 520 are arranged. The second contact electrode 261B may be disposed to fill the plurality of first openings 520H.

The second contact electrode 261B filling the first opening 520H may include an upper surface, a lower surface, and a side surface. The plane where the upper surface of the second contact electrode 261B is located may coincide with the plane where the upper surface of the second insulating layer 520 is located. The lower surface of the second contact electrode 261B may be disposed on the upper surface of the first electrode 210, and the side surface thereof may be parallel to the sidewall of the first opening 520H. The lower surface of the second contact electrode 261B may be in contact with the first electrode 210 disposed on the upper surface of the first inner bank 410.

The third insulating layer 530 may be disposed on the upper surface of a portion of the second contact electrode 261B filling the plurality of first openings 520H, and the second light emitting element 300B or the third light emitting element 300C may be disposed on the upper surface of another portion of the second contact electrode 261B.

Referring to FIG. 11, one end region of the second light emitting element 300B is disposed on the second contact electrode 261B. The upper surface of the second contact electrode 261B is in contact with the lower surface of one end region of the second light emitting element 300B. For example, the electrode layer 370 and the second semiconductor 320 in one end region of the second light emitting element 300B may be in contact with the second contact electrode 261B. In the second contact electrode 261B disposed under one end region of the second light emitting element 300B, the lower surface of the second contact electrode 261B is in contact with the first electrode 210, and the upper surface thereof is in contact with the lower surface of one end region of the second light emitting element 300B. Therefore, the second light emitting element 300B may be electrically connected to the first electrode 210 through the second contact electrode 261B.

Referring to FIG. 10 again, the third insulating layer 530 may be disposed on the second insulating layer 520 and the first contact electrode layer 261. The third insulating layer 530 may be disposed on the entire surface of the first electrode 210 to overlap the first electrode 210 disposed on the top and side surfaces of the first inner bank 410 in the thickness direction. The third insulating layer 530 may include a first region disposed on one side surface of the first inner bank 410 facing the second inner bank 420, a second region disposed on the upper surface of the inner bank 410, and a third region disposed on the other side surface of the first inner bank 410 and extending outward.

The first region of the third insulating layer 530 may be disposed on the upper surface of the first light emitting element 300A to completely cover the first contact electrode 261A, completely cover one end region of the first light emitting element 300A and expose a portion of the other end region of the first light emitting element 300A. The third insulating layer 530 disposed on the first contact electrode 261A may be disposed to completely cover the first contact electrode 261A and overlap at least a portion of the second insulating layer 520 adjacent to the first contact electrode 261A in the third direction DR3. The third insulating layer 530 disposed on the first contact electrode 261A may be interposed between the first contact electrode 261A and the second contact electrode layer 262 (or the third contact electrode) overlapping the first contact electrode 261A to insulate the first contact electrode 261A and the third contact electrode 262 (or the second contact electrode layer) from each other.

The second region of the third insulating layer 530 may be disposed on the second insulating layer 520 and the second contact electrode 261B, and may be provided with the plurality of second openings 530H as described above. The second opening 530H formed in the third insulating layer 530 may not overlap the first opening 520H in the third direction DR3. Accordingly, the third insulating layer 530 may completely overlap the second contact electrode 261B filling the first opening 520H in the third direction DR3.

The third insulating layer 530 disposed on the second insulating layer 520 and the second contact electrode 261B may be interposed between the second contact electrode 261B and the second contact electrode layer 262 (or the third contact electrode) overlapping the second contact electrode 261B or may be disposed not to overlap the first opening 520H and the second opening 530H each other, so as to insulate the second contact electrode 261B and the third contact electrode 262 (or the second contact electrode layer) from each other.

The third region of the third insulating layer 530 may extend outward from the second region of the third insulating layer 530 to completely cover the first electrode 210 disposed on the other side surface of the first inner bank 410.

Some of the plurality of second openings 530H formed in the third insulating layer 530 may expose at least a portion of the second insulating layer 520 overlapping the second openings 530H under the third insulating layer 530. Other some of the plurality of second openings 530H may expose at least a portion of the other end region of the second light emitting element 300B. Other some of the plurality of second openings 530H may expose at least a portion of the third light emitting element 300C.

The second contact electrode layer 262 may be disposed on the third insulating layer 530 and the second electrode 220. The second contact electrode layer 262 may be disposed on the entire surface of the second electrode 220 to contact the second electrode 220. The second contact electrode layer 262 may be a third contact electrode 262 that contacts the second electrode 220 to electrically connect at least some of the plurality of light emitting elements 300 to the second electrode 220. Hereinafter, for convenience of explanation, the terms of the second contact electrode layer 262 and the third contact electrode 262 may be used interchangeably.

The third contact electrode 262 may be entirely disposed on the first electrode 210 and the second electrode 220. The third contact electrode 262 may be entirely disposed on the second electrode 220, and may extend from the second electrode 220 to be disposed even on the third insulating layer 530. The third contact electrode 262 may be disposed to fill the plurality of second openings 530H.

Referring to FIG. 11, the third contact electrode 262 may be in contact with the other end region of the second light emitting element 300B through the plurality of second openings 530H. The third contact electrode 262 may be disposed to completely cover the upper and side surfaces of the other end region of the second light emitting element 300B exposed by the second opening 530H. Accordingly, the second light emitting element 300B may be electrically connected to the second electrode 220 through the third contact electrode 262 disposed in the second opening 530H.

As described above, the lower surface of one end region of the second light emitting element 300B is in contact with the upper surface of the second contact electrode 261B contacting the first electrode 210 to electrically connect the second light emitting element 300B to the first electrode 210, and the upper and side surfaces of the other end region of the second light emitting element 300B are in contact with the third contact electrode 262 contacting the second electrode 220 to electrically connect the second light emitting element 300B to the second electrode 220. Accordingly, not only the first light emitting element 300A disposed between the first electrode 210 and the second electrode 220, but also the second light emitting element 300B disposed on the first electrode 210 may be electrically connected to the electrodes 210 and 220 through the contact electrodes 261A, 261B, and 262 to emit light. Therefore, luminance may be improved as compared with the case where the first light emitting element 300A disposed between the first electrode 210 and the second electrode 220 emits light.

Figure 12:
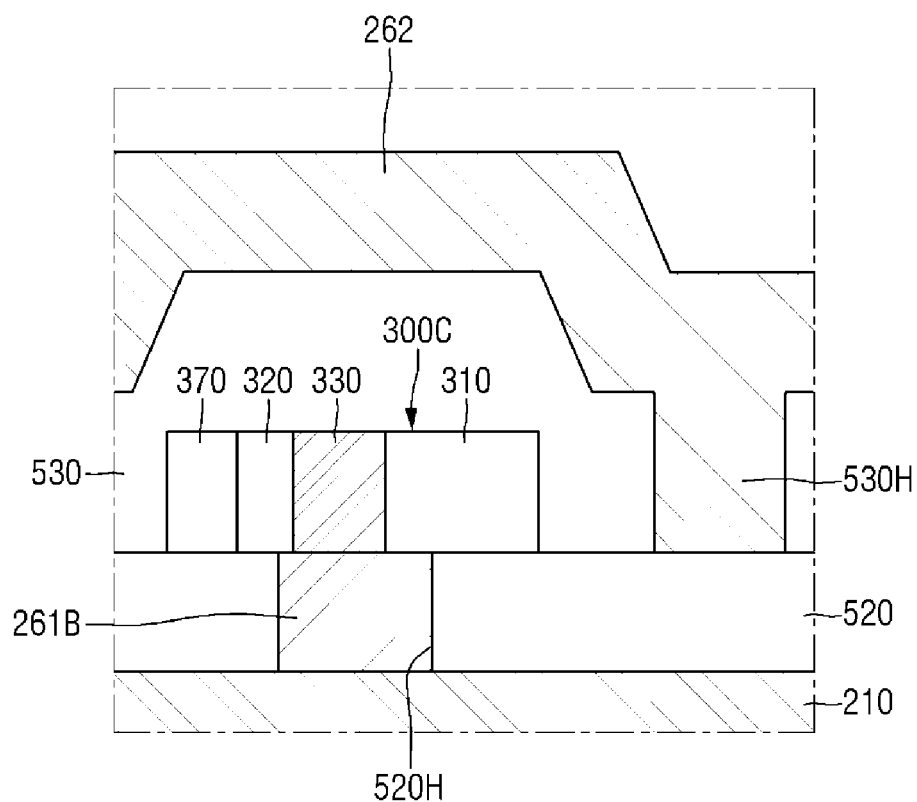
FIG. 12 is an enlarged cross-sectional view illustrating an example of a third light emitting element, a plurality of insulating layers, and a plurality of contact electrodes, according to some embodiments of the present disclosure.

FIG. 12 is an enlarged cross-sectional view illustrating an example of a third light emitting element, a plurality of insulating layers, and a plurality of contact electrodes, according to some embodiments of the present disclosure.

Referring to FIG. 12, the third light emitting element 300C overlaps the first opening 520H in the third direction DR3, and does not overlap the second opening 530H in the third direction DR3. Therefore, the third light emitting element 300C contacts the upper surface of the second contact electrode 261B (and therefore may be connected to the first electrode 210 via the second contact electrode 261B), but does not contact the third contact electrode 262, so that the third light emitting element 300C is not electrically connected to the second electrode 220. Accordingly, the third light emitting element 300C may not emit light because it is not electrically connected to at least one of the two electrodes 210 and 220.

Hereinafter, a method of manufacturing the aforementioned display device 10 will be described.

FIGS. 13-17 are cross-sectional views illustrating process steps of a method of manufacturing the display device of FIG. 10, according to some embodiments of the present disclosure.

Figure 13:
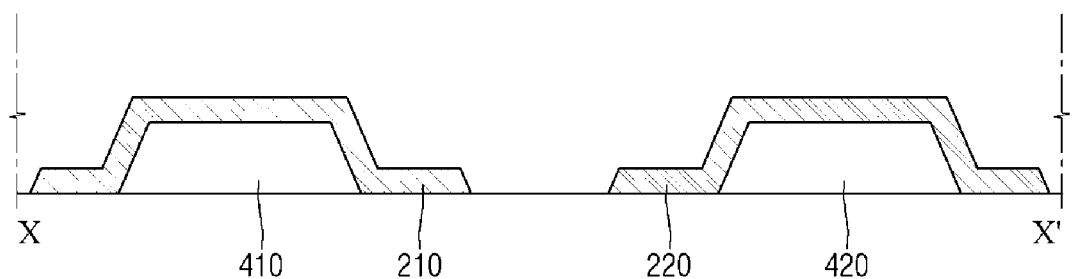
FIGS. 13-17 are cross-sectional views illustrating process steps of a method of manufacturing the display device of FIG. 10, according to some embodiments of the present disclosure.

Referring to FIG. 13, first, a first inner bank 410 and a second inner bank 420 are formed on a via layer 177 so as to be spaced from each other, and a first electrode conductive layer is formed on each of the first inner bank 410 and the second inner bank 420. The patterned first electrode conductive layer may be formed by the same mask process. For example, a first electrode 210 and a second electrode 220 may be formed by the same mask process.

Figure 14:
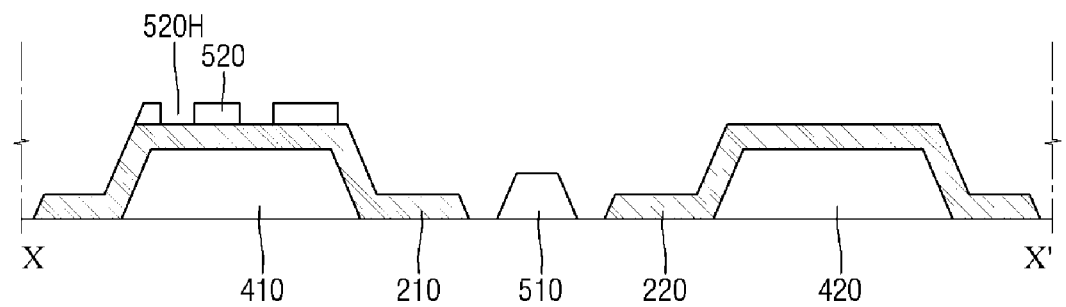

Subsequently, referring to FIG. 14, a patterned first insulating layer 510 and a patterned second insulating layer 520 are formed on the via layer 177 on which the first electrode 210 and the second electrode 220 are formed. The first insulating layer 510 and the second insulating layer 520 are formed by depositing an insulating material layer on the via layer 177 and on the first electrode 210, respectively. Subsequently, a plurality of first openings 520H exposing a portion of the first electrode 210 disposed on the upper surface of the first inner bank 410, and a photoresist pattern exposing at least a portion of the via layer 177 between the first electrode 210 and the second electrode 220 are formed on the insulating material layer, and the insulating material layer is etched using the photoresist pattern as an etching mask to form the first insulating layer 510 and the second insulating layer 520 including the plurality of openings 520H. In some example embodiments, the first insulating layer 510 and the second insulating layer 520 are formed by the same mask process, but the present disclosure is not limited thereto, and the first insulating layer 510 and the second insulating layer 520 may be formed sequentially by different masks from each other.

Figure 15:
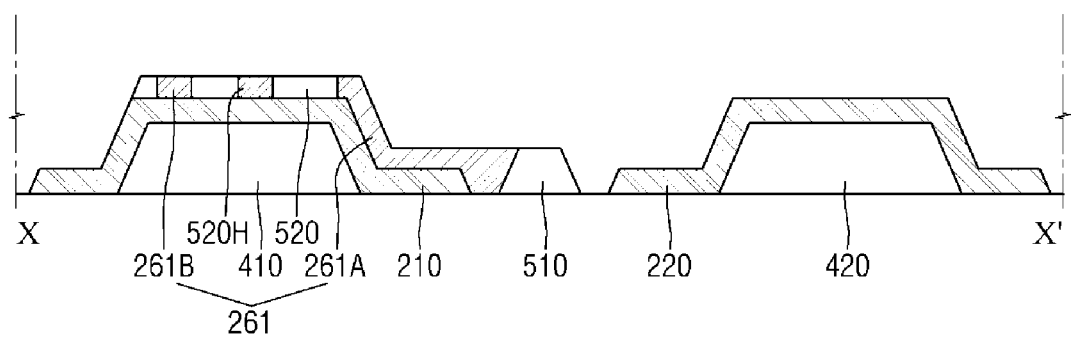
Figure 16:
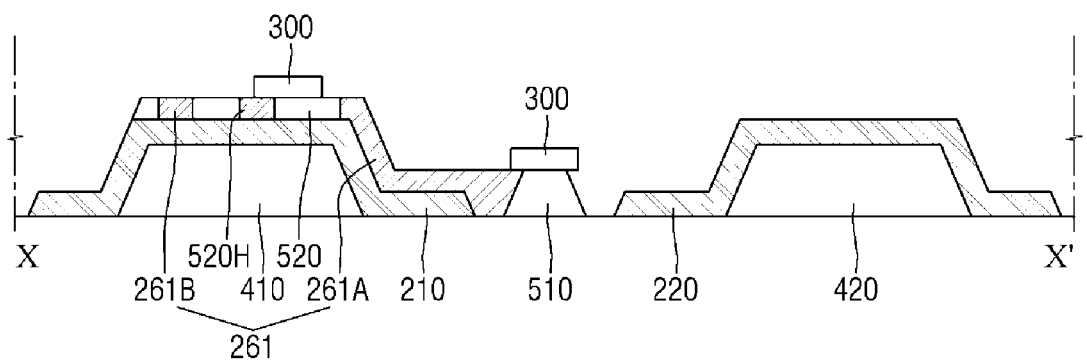

Subsequently, referring to FIG. 15, a patterned first contact electrode layer 261 is formed on the first electrode 210 exposed by the first insulating layer 510 and the second insulating layer 520. The first contact electrode layer 261 may be formed by the same mask process. For example, a material layer for the first contact electrode layer 261 is entirely deposited. In the deposition process, the material layer for the first contact electrode layer 261 may be deposited to the inside of the plurality of first openings 520H. Subsequently, referring to FIG. 16, a plurality of light emitting elements 300 may be sprayed using an inkjet printing apparatus. The plurality of light emitting elements 300 may include a first light emitting element 300A disposed on the first insulating layer 510 and second and third light emitting elements 300B and 300C disposed on the second insulating layer 520.

Figure 17:
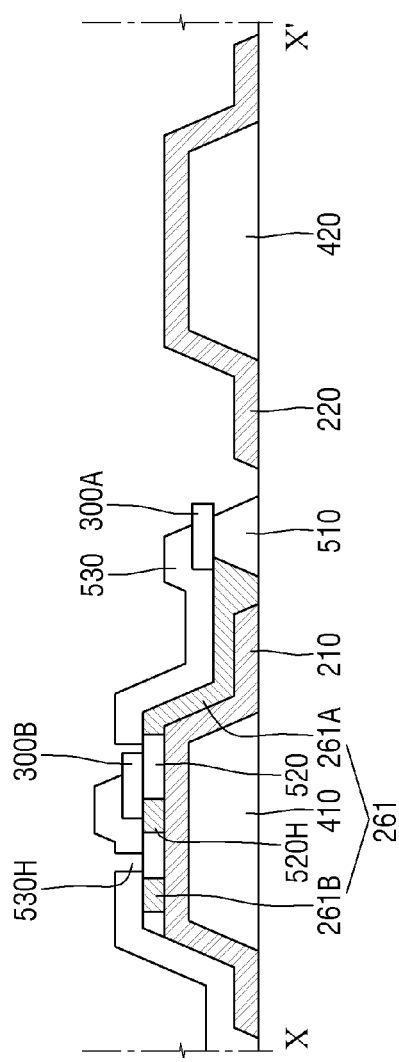

Subsequently, referring to FIG. 17, a third insulating layer 530 having a plurality of second openings 530H is formed on the second insulating layer 520 and the plurality of light emitting elements 300. The third insulating layer 530 having the plurality of second openings 530H is formed by depositing an insulating material layer on the first electrode 210 and the second electrode 220. Subsequently, an etching process is performed on the insulating material layer so as to expose the entire surface of the second electrode 220 and a portion of the first electrode 210 through the plurality of first openings 520H disposed on the upper surface of the first inner bank 410 and the plurality of second openings 530H exposing at least a portion of the second insulating layer 520. Subsequently, a second contact electrode layer 262 is formed on the second electrode 220 and the third insulating layer 530.

Hereinafter, other embodiments will be described. In the following embodiments, the same components as those previously described will be omitted or simplified, and differences will be mainly described.

Figure 18:
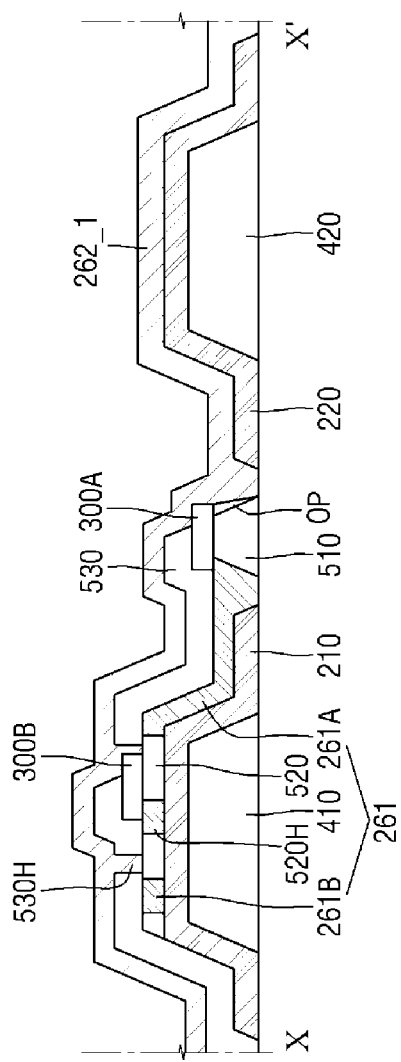
FIG. 18 is another cross-sectional view taken along the line X-X' in FIG. 7, according to some embodiments of the present disclosure.

FIG. 18 is another cross-sectional view taken along the line X-X' in FIG. 7, according to some embodiments of the present disclosure. FIG. 18 illustrates a case where the third contact electrode forms a space between the first insulating layer 510 and the second inner bank 420.

Referring to FIG. 18, a third contact electrode 262_1 may be disposed on the second electrode 220 and extend to cover the other end region of the first light emitting element 300A. The third contact electrode 262_1 may be formed after forming the first contact electrode 261A and then dispersing the plurality of light emitting elements 300. The other end of the first light emitting element 300A disposed on the first insulating layer 510 may partially protrude from the first insulating layer 510, and thus the third contact electrode 262_1 may not be disposed between the first insulating layer 510 and the second electrode 220 by the first light emitting element 300A. Accordingly, in such a case, a space OP without the third contact electrode 262_1 may be formed between the first insulating layer 510 and the second electrode 220.

Figure 19:
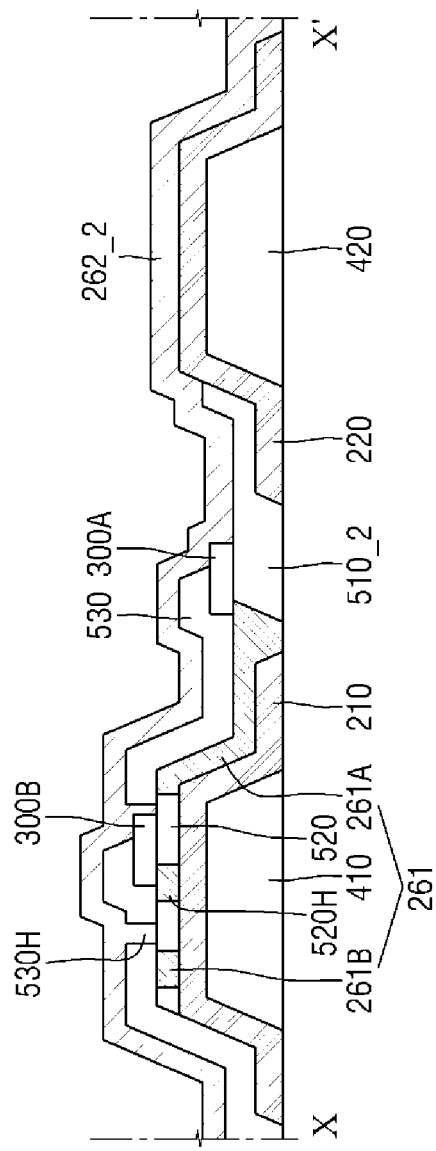
FIG. 19 is still another cross-sectional view taken along the line X-X' in FIG. 7, according to some embodiments of the present disclosure.

FIG. 19 is still another cross-sectional view taken along the line X-X' in FIG. 7, according to some embodiments of the present disclosure. FIG. 19 illustrates a case where the first insulating layer is formed to cover at least a portion of the second electrode.

Referring to FIG. 19, a first insulating layer 510_2 is disposed to partially cover the second electrode 220. The first insulating layer 510_2 may be disposed to cover most of the upper surface of the second electrode 220, and may expose a portion of the second electrode 220. In such a case, the width of the upper surface of the first insulating layer 510_2 may be formed to be longer than the length h of the light emitting element 300, and thus the light emitting element 300 may be stably disposed. However, even in this case, the first insulating layer 510_2 may be spaced from the first electrode 210, and the first contact electrode 261A may be disposed in a space between the first electrode 210 and the first insulating layer 510_2.

According to the display device in some embodiments, light emitting elements can be fixed using an insulating layer including a plurality of openings under and over some of the light emitting elements disposed on the electrode.

Further, according to the display device in some embodiments, some light emitting elements can be electrically connected to the electrode through the plurality of openings to emit light.

Although the example embodiments of the present disclosure have been disclosed for illustrative purposes, those skilled in the art will appreciate that various modifications, additions and substitutions are possible, without departing from the scope and spirit of the disclosure as disclosed in the accompanying claims.

In concluding the detailed description, those skilled in the art will appreciate that many variations and modifications can be made to the example embodiments without substantially departing from the principles of the present disclosure. Therefore, the disclosed example embodiments of the present disclosure are used in a generic and descriptive sense only and not for purposes of limitation.

What is claimed is:

1. A display device, comprising:
a substrate;
a first electrode and a second electrode spaced from each other on the substrate;
a first insulating layer on the first electrode;
a first light emitting element located between the first electrode and the second electrode;
a second light emitting element on the first insulating layer and spaced from the first light emitting element, both end regions of the second light emitting element being on the first electrode; and
a second insulating layer on the first insulating layer and covering at least a portion of the second light emitting element,
wherein the first insulating layer includes at least one first opening penetrating the first insulating layer to expose a portion of the first electrode,
wherein the second insulating layer includes at least one second opening penetrating the second insulating layer to expose a portion of the first insulating layer,
wherein the at least one first opening and the at least one second opening do not overlap each other in a thickness direction of the substrate, and
wherein one end region of the second light emitting element overlaps one of the at least one first opening and the other end region of the second light emitting element overlaps one of the at least one second opening.

2. The display device of claim 1,
wherein the first light emitting element and the second light emitting element are electrically connected to the first electrode and the second electrode.

3. The display device of claim 1, further comprising:
a first contact electrode layer interposed between the first electrode and the second insulating layer,
wherein the first contact electrode layer comprises a first contact electrode contacting one end region of the first light emitting element and the first electrode, and a second contact electrode filling the at least one first opening.

4. The display device of claim 3,
wherein the second contact electrode is in contact with one end region of the second light emitting element and the first electrode.

5. The display device of claim 3, further comprising:
a third contact electrode contacting the other end region of the first light emitting element and the second electrode.

6. The display device of claim 5,
wherein the third contact electrode is in contact with the other end region of the second light emitting element through the at least one second opening.

7. The display device of claim 6,
wherein the first contact electrode and the third contact electrode are electrically insulated from each other.

8. The display device of claim 3,
wherein the first contact electrode and the second contact electrode are spaced from each other.

9. The display device of claim 1,
wherein a diameter of the at least one second opening is smaller than a length of the second light emitting element.

10. A display device, comprising:
a substrate;
a first electrode and a second electrode spaced from each other on the substrate;
a first insulating layer on the first electrode;
a first light emitting element located between the first electrode and the second electrode;
a second light emitting element on the first insulating layer and spaced from the first light emitting element, both end regions of the second light emitting element being on the first electrode;
a second insulating layer on the first insulating layer and covering at least a portion of the second light emitting element; and
a third light emitting element on the first insulating layer and spaced from the first light emitting element and the second light emitting element,
wherein the first insulating layer includes at least one first opening penetrating the first insulating layer to expose a portion of the first electrode,
wherein the second insulating layer includes at least one second opening penetrating the second insulating layer to expose a portion of the first insulating layer,
wherein the at least one first opening and the at least one second opening do not overlap each other in a thickness direction of the substrate,
wherein one end region of the second light emitting element overlaps one of the at least one first opening and the other end region of the second light emitting element overlaps one of the at least one second opening, and wherein the third light emitting element does not overlap at least one of the at least one first opening and the at least one second opening.

11. The display device of claim 10,
wherein the third light emitting element is not electrically connected to at least one of the first electrode or the second electrode.

12. A display device, comprising:
a substrate;
a first electrode and a second electrode spaced from each other on the substrate;
a first insulating layer located between the first electrode and the second electrode and on the substrate;
a second insulating layer on the first electrode and having a plurality of first openings exposing at least a portion of the first electrode;
a first contact electrode layer on the first electrode exposed by the second insulating layer;
a first light emitting element on the first insulating layer;
a second light emitting element on the second insulating layer; and
a second contact electrode layer on the second electrode and the first contact electrode layer.

13. The display device of claim 12,
wherein the first contact electrode layer is in contact with the first electrode, and the second contact electrode layer is in contact with the second electrode.

14. The display device of claim 13, further comprising:
a third insulating layer interposed between the first contact electrode layer and the second contact electrode layer.

15. The display device of claim 14,
wherein the third insulating layer includes a plurality of second openings penetrating the third insulating layer, and wherein one end region of the second light emitting element overlaps one of the first openings and the other end region of the second light emitting element overlaps one of the second openings.

16. The display device of claim 15,
wherein the first contact electrode layer is in contact with one end region of the second light emitting element through the one of the first openings, and the second contact electrode layer is in contact with the other end region of the second light emitting element through the one of the second openings.

17. The display device of claim 12,
wherein the second insulating layer is spaced from the first insulating layer.

18. The display device of claim 12,
wherein the first contact electrode layer and the second contact electrode layer are insulated from each other.

19. The display device of claim 12,
wherein the first contact electrode layer comprises a first contact electrode contacting the first electrode and one end region of the first light emitting element, and a second contact electrode contacting the first electrode and one end region of the second light emitting element.

20. The display device of claim 19,
wherein the second contact electrode layer comprises a third contact electrode contacting the second electrode, the other end region of the first light emitting element, and the other end region of the second light emitting element.

* * * * *